US012620782B2

(12) United States Patent
Lyubarsky et al.

(10) Patent No.: US 12,620,782 B2
(45) Date of Patent: May 5, 2026

(54) OPTICAL METHODS FOR REDUCING POINT SPREAD FUNCTION IN PHASE LIGHT MODULATOR APPLICATIONS

(71) Applicant: TEXAS INSTRUMENTS INCORPORATED, Dallas, TX (US)

(72) Inventors: Alexander Lyubarsky, Dallas, TX (US); Terry A. Bartlett, Dallas, TX (US); Kristofer Oberascher, Van Alstyne, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 672 days.

(21) Appl. No.: 18/146,094

(22) Filed: Dec. 23, 2022

(65) Prior Publication Data

US 2023/0327398 A1     Oct. 12, 2023

Related U.S. Application Data

(60) Provisional application No. 63/366,895, filed on Jun. 23, 2022, provisional application No. 63/322,272, filed on Mar. 22, 2022.

(51) Int. Cl.
*H01S 5/40* (2006.01)

(52) U.S. Cl.
CPC .......... *H01S 5/4031* (2013.01); *H01S 5/4012* (2013.01); *H01S 5/4081* (2013.01)

(58) Field of Classification Search
CPC .. G03B 21/005; G03B 21/006; G03B 21/008; G03B 21/28; G03B 21/208; G03B 21/2033; G03B 21/2053; H04N 9/315; H04N 9/3126; H04N 9/3161; H04N 9/3188; H04N 9/3197; H01S 5/005; H01S 5/0071; H01S 5/2216; H01S 5/4012; H01S 5/4031; H01S 5/4081
See application file for complete search history.

(56) References Cited

U.S. PATENT DOCUMENTS

| | | | | |
|---|---|---|---|---|
| 2005/0128605 | A1* | 6/2005 | Cole | H04N 9/3152 |
| | | | | 348/E9.027 |
| 2007/0014008 | A1* | 1/2007 | Kennedy | G02B 27/123 |
| | | | | 359/489.08 |
| 2018/0292663 | A1* | 10/2018 | Richards | G02B 27/0961 |
| 2019/0214785 | A1* | 7/2019 | Zhang | H01S 5/42 |
| 2020/0413015 | A1* | 12/2020 | Asai | G09G 5/377 |
| 2021/0003854 | A1* | 1/2021 | Bartlett | G03H 1/32 |
| 2021/0119421 | A1* | 4/2021 | Zhou | H01S 5/0612 |
| 2021/0368149 | A1* | 11/2021 | Suzuki | H04N 9/3147 |

OTHER PUBLICATIONS

Prosecution History, U.S. Appl. No. 16/808,457, filed Mar. 4, 2020, 171 pages.

* cited by examiner

*Primary Examiner* — Sultan Chowdhury
(74) *Attorney, Agent, or Firm* — Michael T. Gabrik; Frank D. Cimino

(57) ABSTRACT

A system includes at least one laser configured to produce laser light and an optical element configured to produce shaped light responsive to receiving the laser light. The system also includes an optical phase modulator (OPM) optically coupled to the optical element, the OPM configured to modulate the shaped light to produce modulated light, where the optical element is configured to reduce a point spread function of the modulated light in a far field.

19 Claims, 37 Drawing Sheets

500

510

520
522
524
FIG. 5C
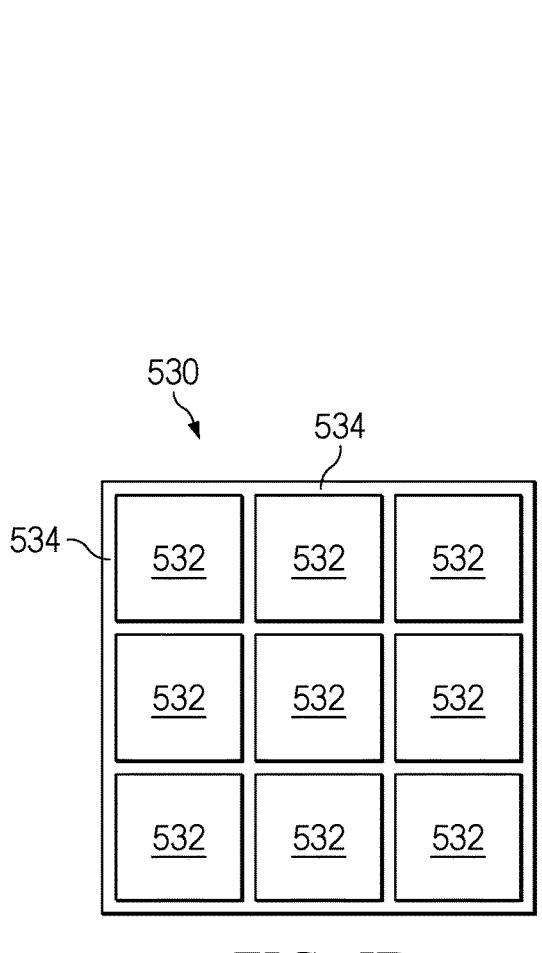
FIG. 5D
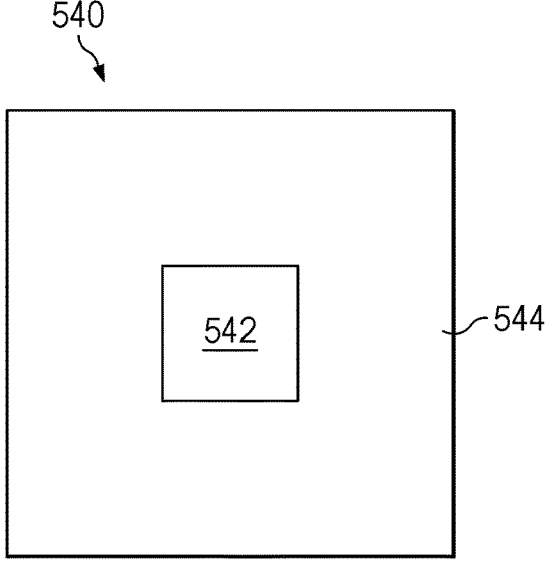
FIG. 5E

650

640

750

760

820

830

860

870

1030

1040

1120

1130

1450

1460

1640

1650

1660

1670

1750

1760

OPTICAL METHODS FOR REDUCING POINT SPREAD FUNCTION IN PHASE LIGHT MODULATOR APPLICATIONS

CROSS-REFERENCE TO RELATED APPLICATION

This application claims priority to U.S. Provisional Patent Application No. 63/366,895, filed on Jun. 23, 2022, and entitled "OPTICAL METHODS FOR REDUCING POINT SPREAD FUNCTION IN PHASE LIGHT MODULATOR APPLICATIONS" and to U.S. Provisional Patent Application No. 63/322,272, filed on Mar. 22, 2022, and entitled "HIGH-BRIGHTNESS, HIGH-DYNAMIC-RANGE IMAGE PROJECTION WITH IMPROVED PHASE SPA-TIAL LIGHT MODULATOR BACKLIGHT RESOLU-TION," which Applications are hereby incorporated herein by reference in their entireties.

TECHNICAL FIELD

The present application relates in general to optical systems, and, in particular, to a system and method for optical phase modulators.

BACKGROUND

In many applications, for example automotive or display applications, it is desirable to provide optical phase modulation. Optical phase modulation may be used in high dynamic range (HDR) applications, automotive headlights, light detection and ranging (LIDAR) applications, and other display applications.

SUMMARY

An example includes a system including at least one laser configured to produce laser light and an optical element configured to produce shaped light responsive to receiving the laser light. The system also includes an optical phase modulator (OPM) optically coupled to the optical element, the OPM configured to modulate the shaped light to produce modulated light, where the optical element is configured to reduce a point spread function of the modulated light in a far field.

Another example includes a system including a first laser assembly configured to produce first light having a first characteristic and a second laser assembly configured to produce second light having a second characteristic different than the first characteristic. The system also includes an optical combining element optically coupled to the first laser assembly and to the second laser assembly, the optical combining element configured to combine the first light having the first characteristic and to the second light having the second characteristic to produce combined light includ-ing the first light and the second light. Additionally, the system includes an optical phase modulator (OPM) optically coupled to the optical combining element, the OPM config-ured to modulate the combined light to produce modulated light, where the system is configured to reduce a point spread function of the modulated light in a far field.

An additional example includes a system including at least one laser configured to produce laser light and an optical element configured to produce shaped light respon-sive to receiving the laser light. The system also includes an optical phase modulator (OPM) optically coupled to the optical element, the OPM configured to modulate the shaped light to produce modulated light, where the optical element is configured to reduce a point spread function of the modulated light in a far field. Additionally, the system includes a spatial light modulator (SLM) optically coupled to the OPM, the SLM configured to produce an image based on the modulated light.

BRIEF DESCRIPTION OF THE DRAWINGS

For a more complete understanding of the illustrative examples of aspects of the present application that are described herein and the advantages thereof, reference is now made to the following descriptions taken in conjunction with the accompanying drawings, in which:

FIGS. 5A-I illustrate example optical waveguides;

Corresponding numerals and symbols in the different figures generally refer to corresponding parts unless otherwise indicated. The figures are drawn to clearly illustrate the relevant aspects of the illustrative example arrangements and are not necessarily drawn to scale.

DETAILED DESCRIPTION

Although the example illustrative arrangements have been described in detail, it should be understood that various changes, substitutions and alterations can be made herein without departing from the spirit and scope of the present application as defined by the appended claims.

Optical phase modulators (OPMs) produce an image by modulating the phase of laser light to produce a hologram in the far field. Pixel elements of the OPM modulate the phase of the laser light, to produce images by causing interference, including total constructive interference and total destructive interference. OPMs can utilize all, or substantially all, of the received light, because all of the received light may be used to form the hologram. Examples of OPMs include phase light modulators (PLMs) containing mirrors, phase-only liquid crystal on silicon (LCoS) device, or deformable mirror devices. PLMs are microelectromechanical systems (MEMS) devices containing arrays of mirrors having heights adjustable with respect to the surface. In PLMs, voltages applied to memory cells below individual mirrors adjust the heights of corresponding mirrors. In phase-only LCOS devices, light that is linearly polarized along the axis of the liquid crystal molecule is applied to the LCOS device. Voltages are applied to the pixels, which rotate the liquid crystal molecules, to affect the phase of reflected light. Deformable mirrors are MEMS devices in which an applied voltage deforms a mirror by a variable amount.

OPMs are used in a variety of optical projection systems. OPMs may directly produce an image for viewing based on received light. For example, OPMs may be used for optical projectors, smart appliances, automotive ground displays, near-eye displays, 3D direct displays, heads-up displays, smart headlights, LIDAR systems, optical lithography, 3D printing, or other projection applications. In an example, OPMs are used to illuminate spatial light modulators (SLMs) to produce high dynamic range (HDR) images. In HDR applications, the OPM provides more light to bright regions of the SLM and less light to dark regions of the SLM to increase the dynamic range.

In optical projection systems containing an OPMs, it is desirable to increase the power of a laser light source used to illuminate the OPM. However, increasing the power of the laser light source increases the etendue, which increases the point spread function in the far field. High power may be achieved by using multiple laser diodes or arrays of laser diodes, which have large point spread functions in the far field. The point spread function size in the far field depends on the laser etendue relative to the OPM etendue. A large point spread function in the far field may be especially problematic in displaying an image with a small bright spot in a dark field. The point spread function size represents the smallest spot that can be displayed in the field.

Figure 1A:
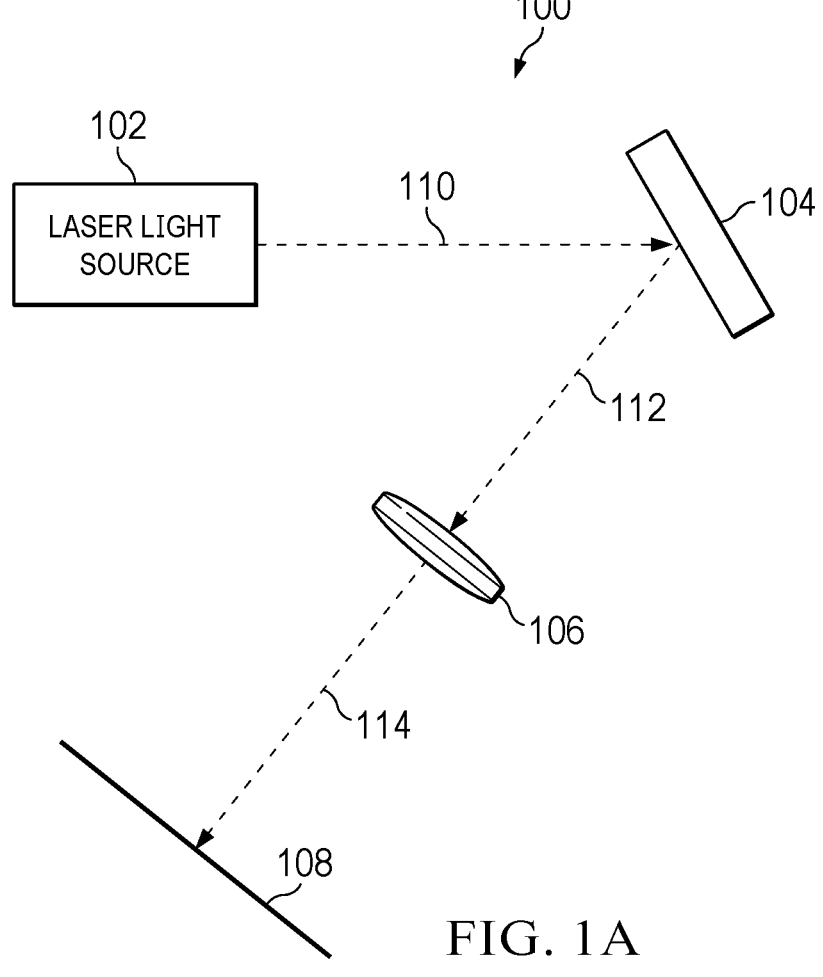
FIGS. 1A-C illustrate example optical projection systems.
Figure 1B:
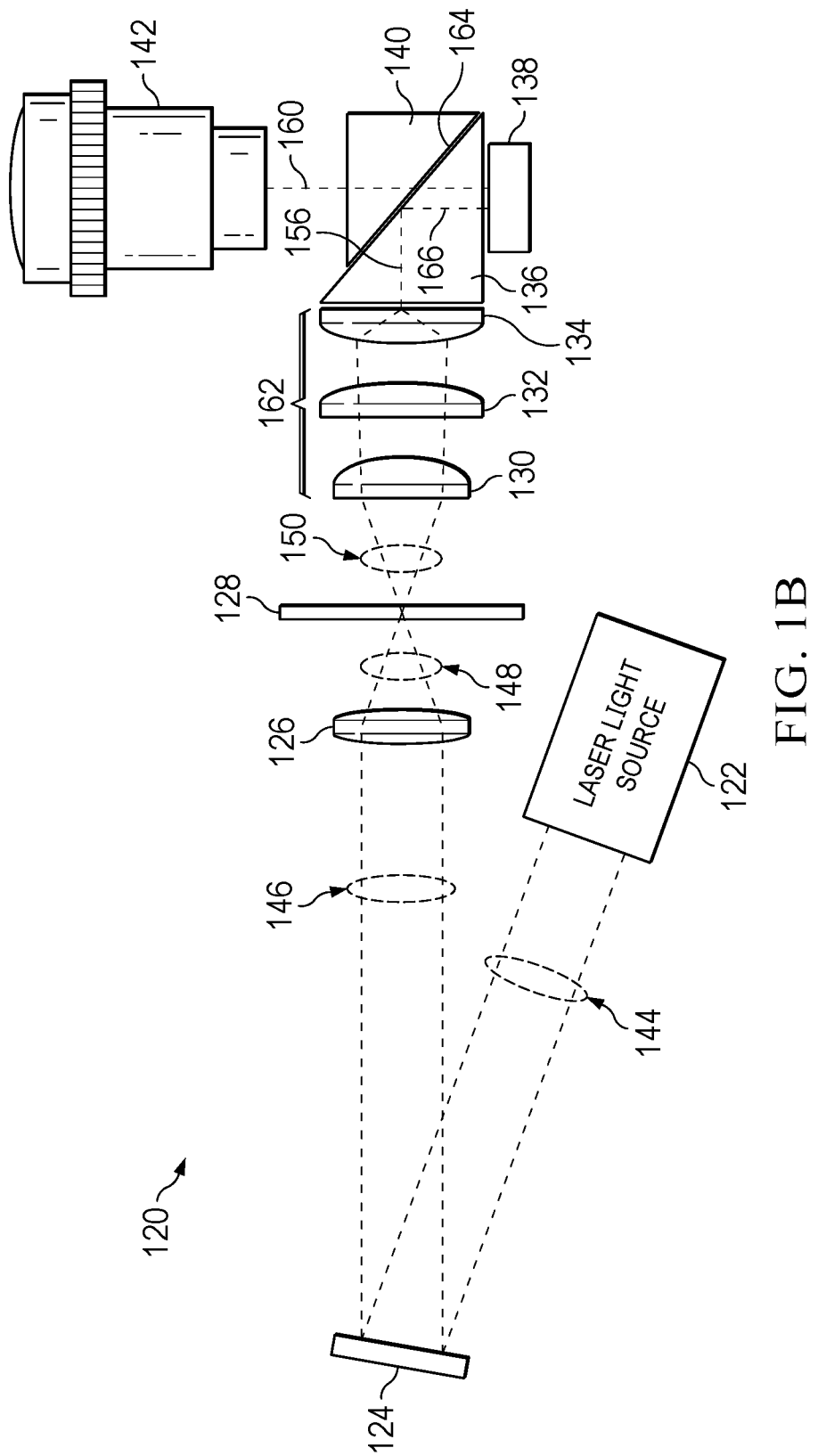
Figure 1C:
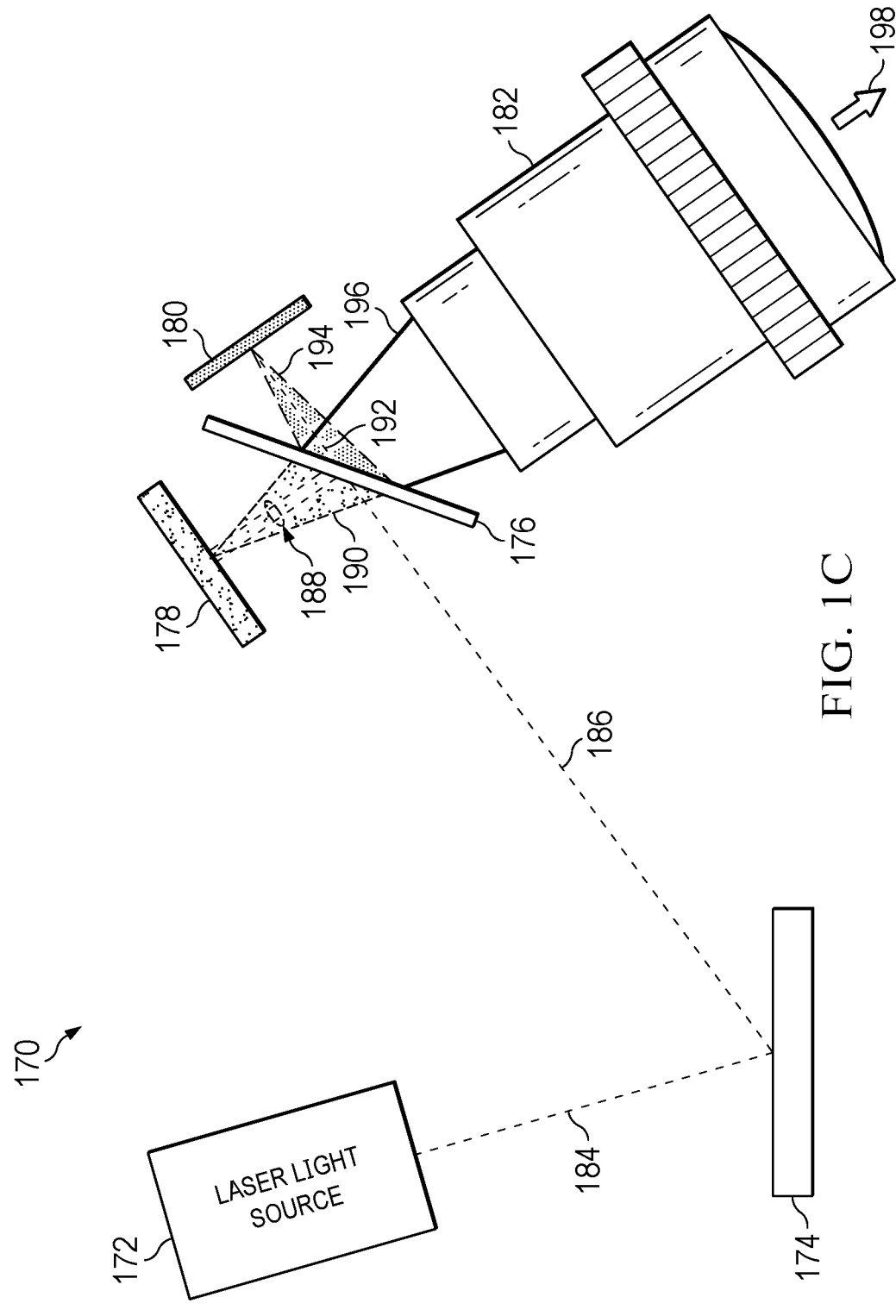

FIGS. 1A-C illustrate example optical projection systems. FIG. 1A illustrate an optical projection system 100. In the optical projection system 100, a laser light source 102 produces shaped light 110. The laser light source 102 includes one or more laser and additional optical elements.

The OPM 104 is optically coupled to the laser light source 102. The OPM 104 may be a PLM, a phase-only LCoS device, or a deformable mirror device. The OPM 104 receives the shaped light 110 and produces modulated light 112 by phase modulating the shaped light 110. Projection optics 106 is optically coupled to the OPM 104. The projection optics 106 produces projection light 114 to form a hologram in the far field on projection surface 108.

FIG. 1B illustrates an optical projection system 120 for projecting HDR images using an OPM 124 and an SLM 138. A laser light source 122 produces shaped light 144 using at least one laser. The laser light source 122 may include additional optical elements optically coupled to the laser light source 122. The shaped light 144 illuminates the OPM 124, which produces modulated light 146 by phase modulating the shaped light 144 to produce a hologram in the far field. At least one lens 126 is optically coupled to the OPM 124. The at least one lens 126 focuses the modulated light 112 to produce focused light 148 to form a hologram in an image plane 128. Illumination optics 162 is optically coupled to the at least one lens 126. In some examples the at least one lens 126 is not used, and the illumination optics is optically coupled to the OPM 124. The illumination optics 162 projects the light 150 towards the surface of the SLM 138. As pictured, the illumination optics 162 includes three lenses: lens 130, lens 132, and lens 134. However, in other examples, different numbers of lenses may be used in the illumination optics 162. A prism 136 is optically coupled to the illumination optics 162. After the illumination optics 162, the light 156 enters the prism 136. The light 156 is reflected at the interface 164 between prism 136 and prism 140 by total internal reflection. The reflected light 166 is directed towards the SLM 138, which modulates the reflected light 166, to produce an image 160. The SLM 138 is optically coupled to the prism 136. The SLM may be a DMD, a transmissive LCD device, or an LCOS device. The image 160 is transmitted through the prism 136, through the interface 164, and through the prism 140. Projection optics 142 is optically coupled to the prism 140. Projection optics 142 then projects the image 160 for display.

FIG. 1C illustrates an optical projection system 170, which may be used for headlight projection. A laser light source 172 includes at least one laser and optical elements, which produce shaped light 184. In one example, shaped light 184 is blue light. The OPM 174 is optically coupled to the laser light source 172. The OPM 174 may be a PLM, a phase-only LCOS device, or a deformable mirror device. The shaped light 184 illuminates the OPM 174. The OPM 174 modulates the phase of the shaped light 184 to produce modulated light 186 to form a hologram in the far field. A dichroic mirror 176 is optically coupled to the OPM 174, to a reflective phosphor 178, to a reflective diffuser 180, and to projection optics 182. The dichroic mirror 176 transmits a portion of the modulated light 186 as light 192 and reflects a portion of the light 186 as light 188. In an example, the dichroic mirror 176 transmits 4-6% of the modulated light 186 as light 192 and reflects 94-96% of the modulated light 186 as light 188. The light 188 illuminates a reflective phosphor 178, which produces phosphor light 190 and directs the phosphor light 190 towards the dichroic mirror 176. The phosphor light 190 is a different color than light 188. In an example, the reflective phosphor 178 is a yellow phosphor, the light 188 is yellow light containing red light and green light, and the light 188 is blue light. The dichroic mirror 176 transmits the phosphor light 190 as a portion of the light 196. The light 192 illuminates the reflective diffuser 180. The reflective diffuser 180 reflects and diffuses the light 192 to produce diffused light 194. Diffusing the light improves the uniformity. The diffused light 194 is the same color as the light 192. The dichroic mirror 176 transmits a portion of the diffused light 194, for example 4-6% of the diffused light 196 and reflects a portion of the diffused light 194, for example 94-96% of the diffused light 196, as a portion of the light 196. The projection optics 182 projects the light 196 to produce projected light 198. The projected light 198 is projected, for example on a road. The projected light 198 may project symbols on the road, and/or may implement a smart headlight.

Figure 2A:
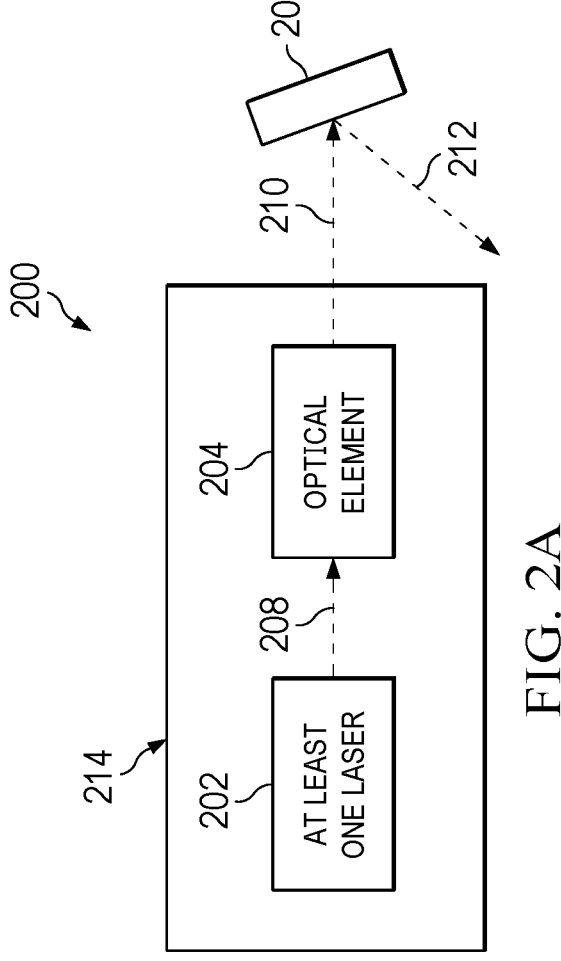
FIG. 2A illustrates another example optical projection system.
Figure 2B:
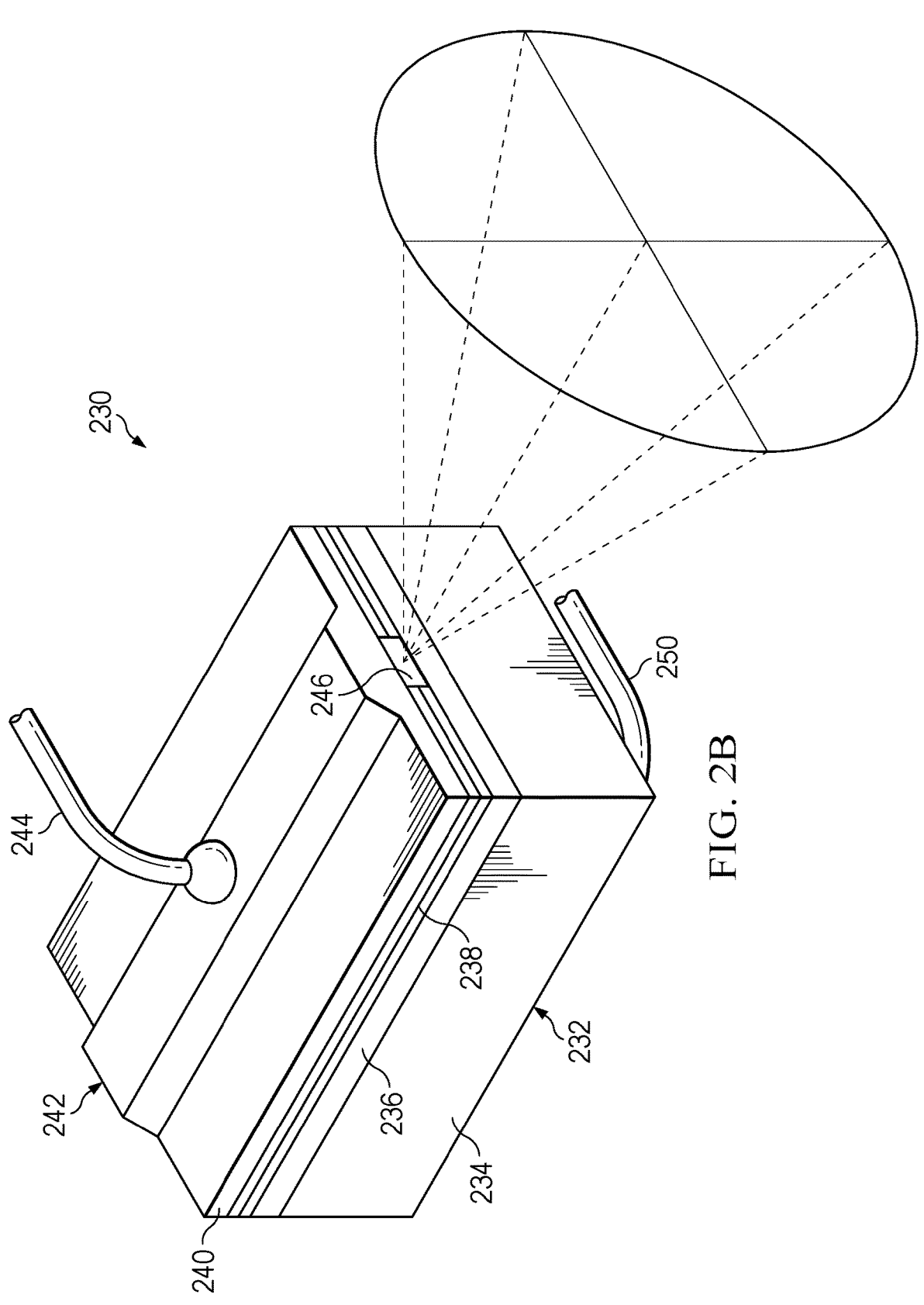
FIG. 2B illustrates an example edge emitting laser diode.
Figure 2C:
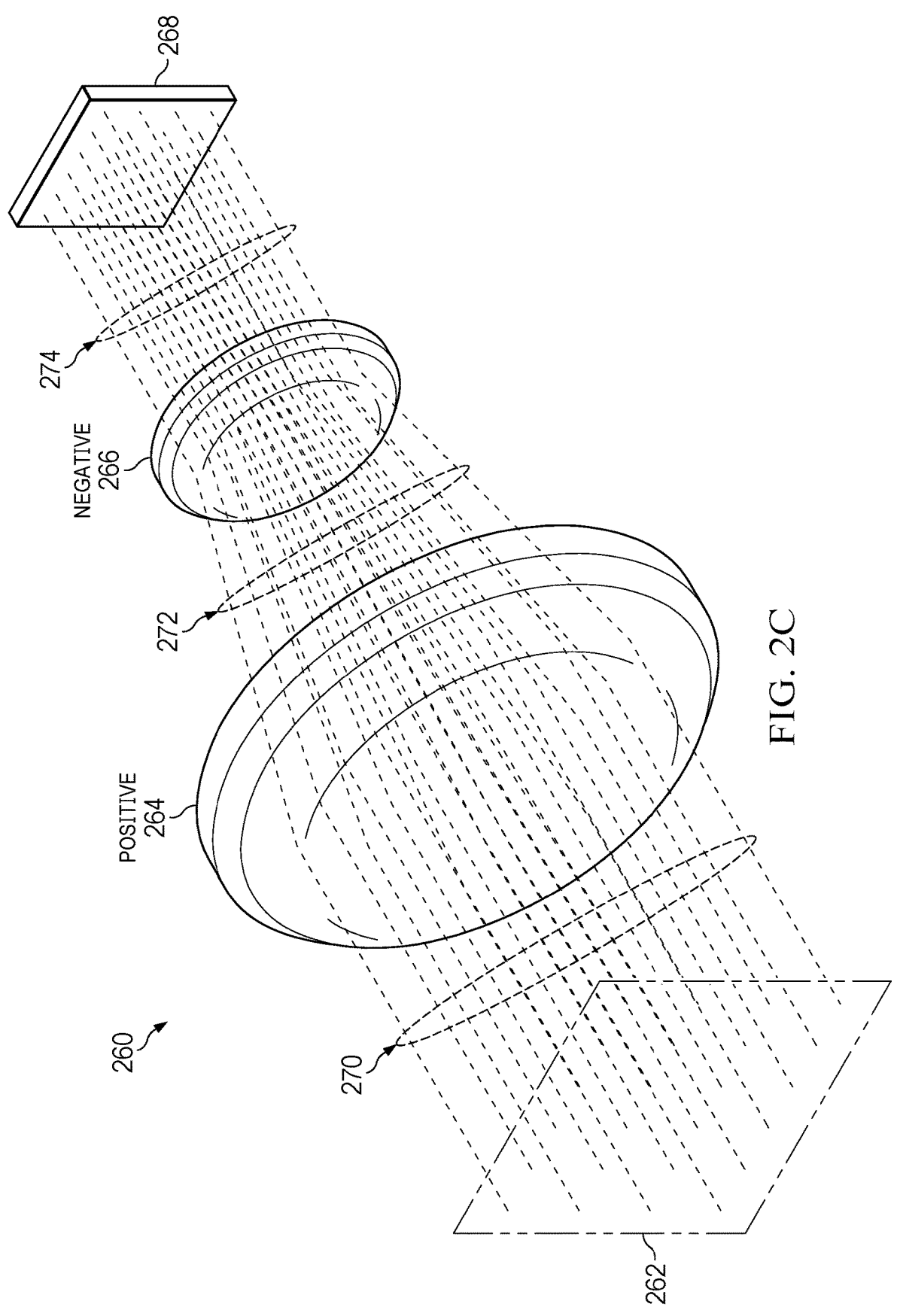
FIG. 2C illustrates example beam shaping optics.

FIG. 2A illustrates an optical projection system 200, FIG. 2B illustrates an edge emitting laser diode 230, and FIG. 2C illustrates beam shaping optics 260. The optical projection system 200 includes a laser light source 214 and an OPM 206 optically coupled to the laser light source 214. The laser light source 214 may be an example of the laser light source 102 illustrated in FIG. 1A, the laser light source 122 illustrated in FIG. 1B, or the laser light source 172 illustrated in FIG. 1C. The laser light source 214 includes at least one laser 202 optically coupled to an optical element 204. The at least one laser 202 includes one or more laser which produces laser light 208. The at least one laser 202 may include a single laser diode, multiple lasers, or a laser array, for example an array of multi-mode laser diodes. The optical element 204 is an optical element configured to reduce the point spread function in the far field of an image produced by the optical projection system 200, as well as additional optical elements. The optical element 204 produces shaped light 210 responsive to receiving the laser light 208. In some examples, the optical element 204 may include an optical waveguide, a variable aperture, a slow-axis collimation (SAC) lens, a fast-axis collimation (FAC) lens, a mirror, a dichroic mirror, a polarizing beam splitter (PBS), multiple mirrors, a cylindrical lens, and/or beam shaping optics. The OPM 206 modulates the phase of the shaped light 210 to produce modulated light 212. The OPM 206 may be a PLM, a phase-only LCOS device, or a deformable mirror device. The modulated light 212 forms a hologram in the far field. The modulated light 212 may be directly projected as a hologram, for example on a projection display or as a headlight, used as illumination for an SLM to produce an HDR image or for other applications, or used for LIDAR.

FIG. 2B illustrates the edge emitting laser diode 230. The edge emitting diode may be an example of the at least one laser 202 illustrated in FIG. 2A. In some examples, the at least one laser 202 contains an array of the edge emitting laser diodes. The edge emitting laser diode 230 contains a substrate 234. On a bottom surface 232 of the substrate 234 is a bottom contact (not pictured). A wire 250 is coupled to the bottom contact. A cladding (N) layer 236 is on a top surface of the substrate 234. An active layer 238 is on the cladding (N) layer 236. A cladding (P) layer 240 is on the active layer 238. A top contact 242 is on the cladding (P) layer 240. A wire 244 is coupled to the top contact 242. The edge emitting laser diode 230 has an output facet 246. The output facet 246 may be asymmetrical. For example, the output facet 246 may have a vertical width of 1-10 µm and a horizontal length of 20-100 µm or wider. A collimator lens (not pictured) forms the far field spot, which is an image of the output facet 246. The far field spot 248 also has an asymmetrical spot size. The divergence of the laser output may be 10 degrees or less full width half maxima (FWHM) in the horizontal slow-axis and up to 50 degrees FWHM in the vertical fast-axis.

FIG. 2C illustrates beam shaping optics 260. The beam shaping optics 260 contains at least one laser 262, a positive powered lens 264, a negative powered lens 266, and an OPM 268. The at least one laser 262 emits laser light 270. The positive powered lens 264 and the negative powered lens 266, optically coupled to the at least one laser 262, form a reverse Galilean telescope or a reverse beam expander, which is used to compress the laser light 270 to have an appropriate beam area at the OPM 268. In another example, two positive powered lenses (not pictured) are used, to form a reverse Keplerian telescope. The positive powered lens 264 and the negative powered lens 266 may be included in the optical element 204, illustrated in FIG. 2A. The positive powered lens 264 focuses the laser light 270 to produce light 272, and the negative powered lens 266 focuses the light 272 to focus the light 274 towards the OPM 268. In an example with mismatched aspect ratios of the at least one laser 262 and the OPM 268, the positive powered lens 264 and the negative powered lens 266 may be cylindrical lenses, biconic lenses, toroidal lenses, or anamorphic Aspheres. The OPM 268 may be an example of the OPM 206 illustrated in FIG. 2A. In an example, the OPM 268 has an aspect ratio of 16:9. The OPM 206 may be a PLM, a phase-only LCOS device, or a deformable mirror device.

Figure 3:
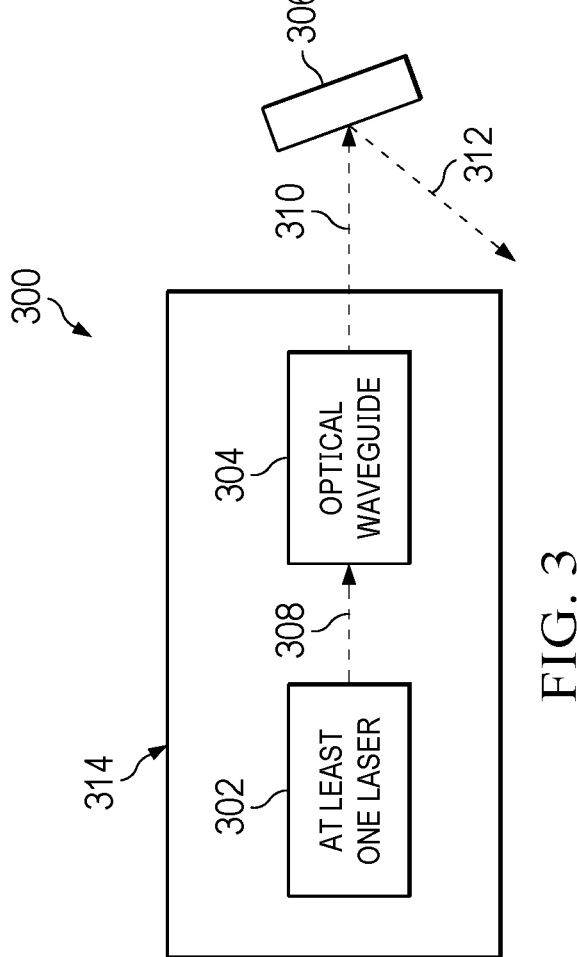
FIG. 3 illustrates an additional example optical projection system.

FIG. 3 illustrates an optical projection system 300 containing a laser light source 314 optically coupled to an OPM 306. The laser light source 314 may be an example of the laser light source 102 illustrated in FIG. 1A, the laser light source 122 illustrated in FIG. 1B, or the laser light source 172 illustrated in FIG. 1C. The laser light source 314 includes at least one laser 302 optically coupled to an optical waveguide 304. In an example, at least one laser 302 is multiple lasers, a laser array, which may be an array of multi-mode laser diodes, or a single laser diode. The at least one laser 302 produces laser light 308. The optical waveguide 304 shapes the distribution of the laser light 308 to produce shaped light 310. The optical waveguide 304 may include one or more optical fibers and/or one or more light guides. In an example, the optical waveguide 304 may be an optical fiber bundle or an array of rectangular light guides. The optical waveguide 304 may have a high numerical aperture, which uniformly illuminates the OPM 306 even when only one optical fiber or light guide propagates light. In an example, the optical waveguide has a core surrounded by a low index cladding. For example, the optical waveguide 304 is a rectangular waveguide with a core and a low index cladding, or a light guide containing a centered rod or an optical fiber. In an additional example, the optical waveguide includes an integrating rod and a variable aperture. The OPM 306 is optically coupled to the laser light source 314. The OPM 306 may be a PLM, a phase-only LCOS device, or a deformable mirror device. The OPM 306 modulates the phase of the shaped light 310 to produce modulated light 312 to produce a hologram in the far field.

Figure 4A:
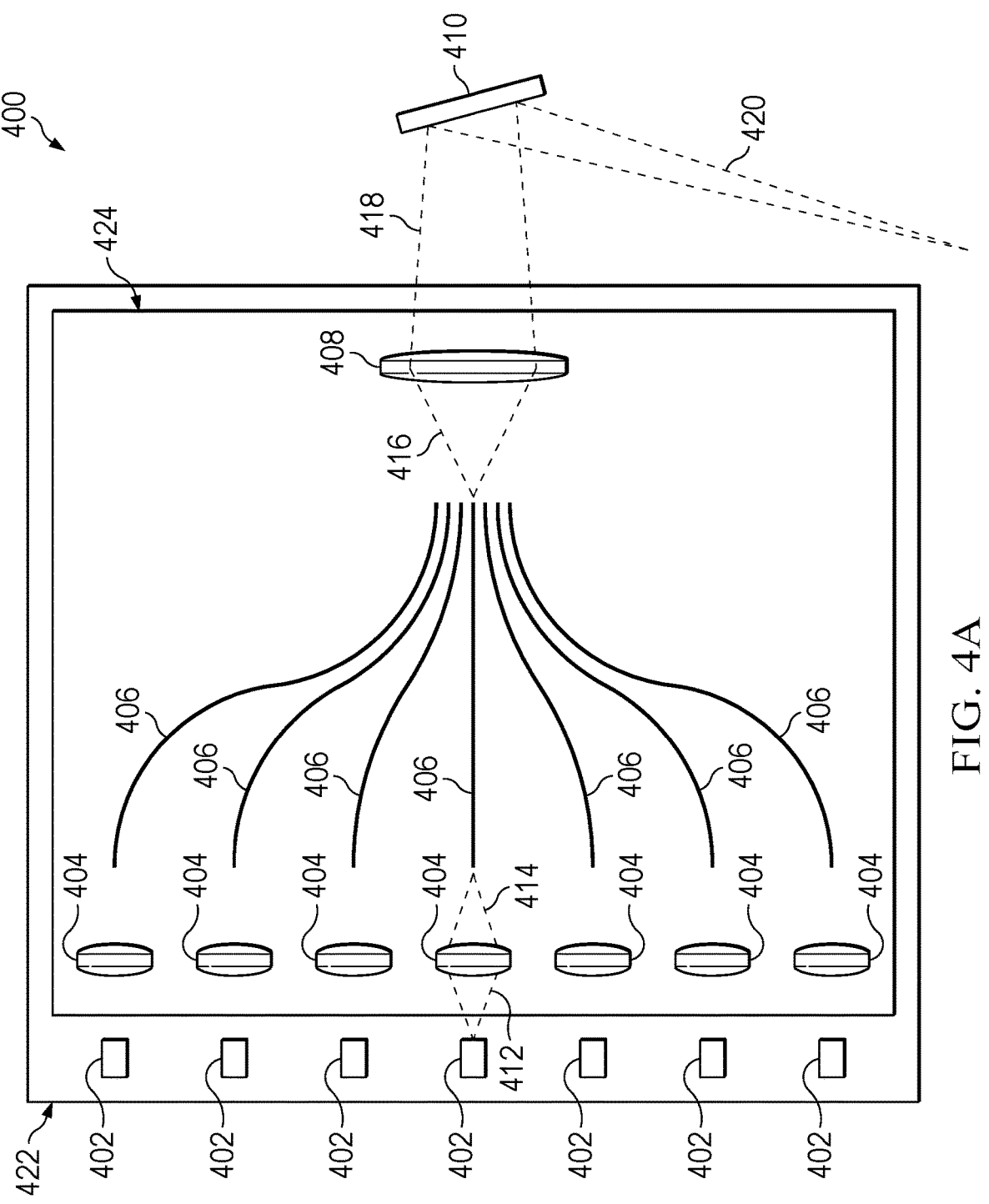
FIGS. 4A-B illustrate the operation of an example optical projection system.
Figure 4B:
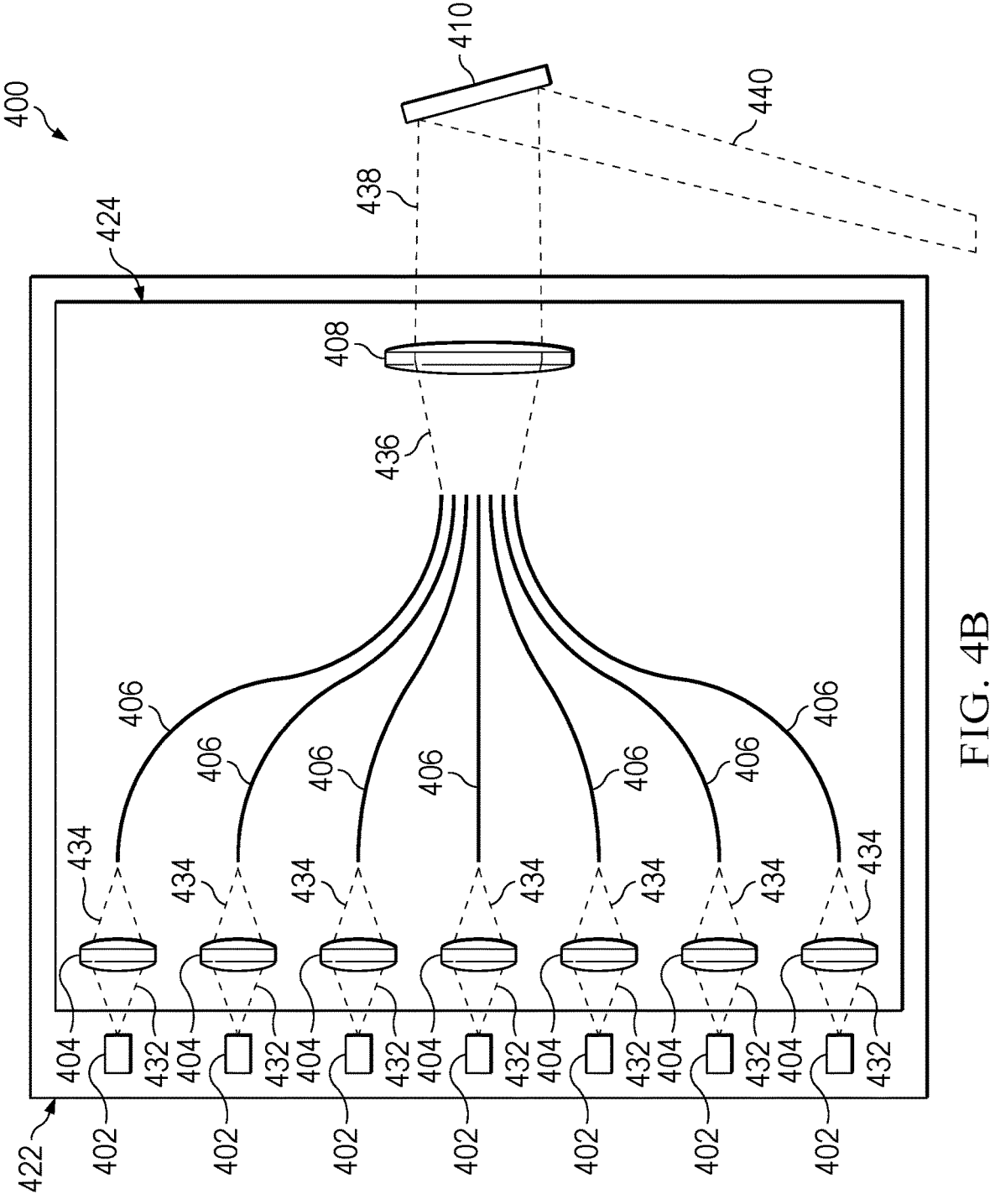

FIGS. 4A-B illustrate the operation of an optical projection system 400 with optical waveguides 406. Optical projection system 400 includes a laser light source 422 optically coupled to an OPM 410. The laser light source 422 may be an example of the laser light source 102 illustrated in FIG. 1A, the laser light source 122 illustrated in FIG. 1B, the laser light source 172 illustrated in FIG. 1C, the laser light source 214 illustrated in FIG. 2A, or the laser light source 314 illustrated in FIG. 3. The laser light source 422 contains at least one laser 402 optically coupled to an optical element 424. The at least one laser 402 may be an example of the at least one laser 202 illustrated in FIG. 2A or the at least one laser 302, illustrated in FIG. 3. In an example, the at least one laser is multiple laser diodes, which may be multi-mode laser diodes. The optical element 424 may be an example of the optical element 204 illustrated in FIG. 2A. The optical element 424 contains the focusing lenses 404, the optical waveguides 406, and the lens 408. The optical waveguides 406 may be an example of optical waveguide 304 in FIG. 3. A variable number of the lasers of the at least one laser 402 may be illuminated, depending on a need for a high luminescence or a small point spread function in the far field. One or a few of the lasers of the at least one laser 402 are illuminated for a small point spread function in the far field and a low luminescence. All of the lasers of the at least one laser 402 are illuminated for a large point spread function in the far field and a high luminescence. A moderate number of the at least one laser 402 are illuminated for a medium sized point spread function in the far field and a moderate luminescence. The focusing lenses 404 focus laser light from corresponding lasers of the at least one laser 402 towards corresponding waveguides of the optical waveguides 406.

FIG. 4A illustrates an example operation of the optical projection system 400 to project scene for a small point spread function in the far field with a low overall luminescence, such as a scene of the night sky with a bright star. In FIG. 4A, one laser of the at least one laser 402 produces the laser light 412, and a corresponding one lens of the focusing lenses 404 focuses the light 414 towards a corresponding waveguide of the optical waveguides 406. The optical waveguides 406 may be multiple optical fibers and/or multiple light guides. The optical waveguides 406 shape the light 414 to produce shaped light 416. The lens 408 is optically coupled to the optical waveguides 406 and to the OPM 410. The shaped light 416 from the optical waveguides 406 is focused by lens 408 as light 418 towards the OPM 410. The OPM 410 modulates the phase of the light 418 to produce modulated light 420 to form a hologram in the far field. The OPM 410 may be a PLM, a phase-only LCOS device, or a deformable mirror device. The image formed by the optical projection system 400 with one of the at least one lasers 402 has a small point spread and a low luminescence.

FIG. 4B illustrates the operation of the optical projection system 400 to project an image of a scene with a higher luminescence at the expense of a larger point spread function in the far field, which may be used, for example, to display a very bright image. In FIG. 4B, all of the lasers of the at least one laser 402 produce laser light 432. The focusing lenses 404 focus the laser light 432 from corresponding lasers of the at least one laser 402 as light 434 towards corresponding waveguides of optical waveguides 406. The optical waveguides 406 shape the light 434 to produce shaped light 436. The lens 408 focuses the shaped light 436 as light 438 towards the OPM 410. The OPM modulates the phase of the light 438 to produce modulated light 440. The modulated light 440 produces a hologram in the far field which has a large point spread function in the far field and a high luminescence, for example a bright outdoor scene with less detail.

Figure 5A:
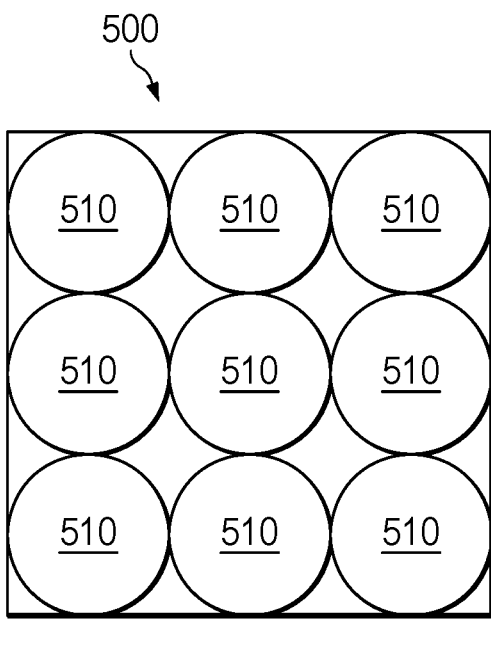
Figure 5B:
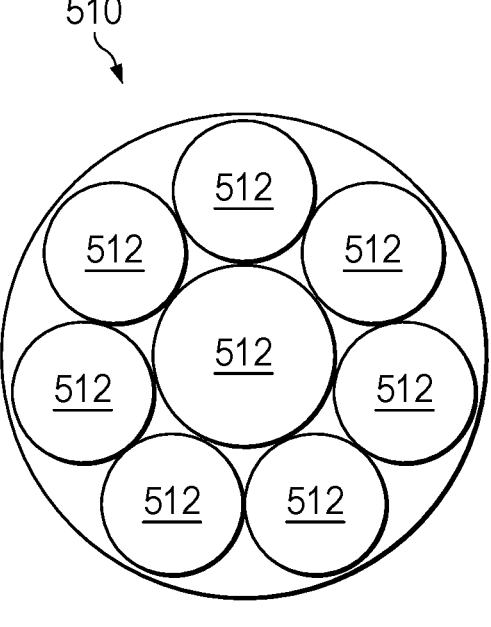

FIGS. 5A-I illustrate various configurations of optical waveguides, which may be examples of the optical waveguides 406 illustrated in FIGS. 4A-B. FIG. 5A illustrates a rectangular optical fiber bundle 500 containing optical fibers 502. In an example, the rectangular optical fiber bundle 500 is a fuse fiber bundles with cladding. In other examples, the rectangular optical fiber bundle 500 is held together by a tube, a plastic coating, or a stainless steel tube. Nine optical fibers 502 are pictured in FIG. 5A, but a different number of optical fibers 502 may be used. Each optical fiber 502 contains a core and cladding around the core (not pictured in FIG. 5A). FIG. 5B illustrates a circular fiber bundle 510 containing optical fibers 512. Eight optical fibers 512 are pictured, but a different number of optical fibers may be used. Each of the optical fibers 512 contains a core and a cladding around the core (not pictured in FIG. 5B). The circular fiber bundle 510 is held together by a tube, a plastic coating, or a stainless steel tube. FIG. 5C illustrates a large optical fiber 520 with a core 522 and low index cladding 524 around the core 522. The core 522 has modes for light from one or a few lasers for low luminescence and a small point spread function in the far field, and the low index cladding 524 has modes for many lasers for high luminescence and a larger point spread function in the far field. FIG. 5D illustrates an array of rectangular light guides 530, which includes light guides 532, which may be rigid light guides and an air gap 534 between the light guides 532. In an example, the air gap 534 is at least 50 μm. In an example, apertures at each end of the light guides 532 prevent tunneling between the light guides 532. Nine light guides 532 are pictured, but a different number of light guides 532 may be used. FIG. 5E illustrates a large rectangular light guide 540 with a core 542 and a cladding 544 around the core 542. The core 542 has modes for light from one or a few lasers for low luminescence and a small point spread function in the far field, and the cladding 544 has modes to transport the light from many lasers for high luminescence and a large point spread function in the far field.

Figure 5F:
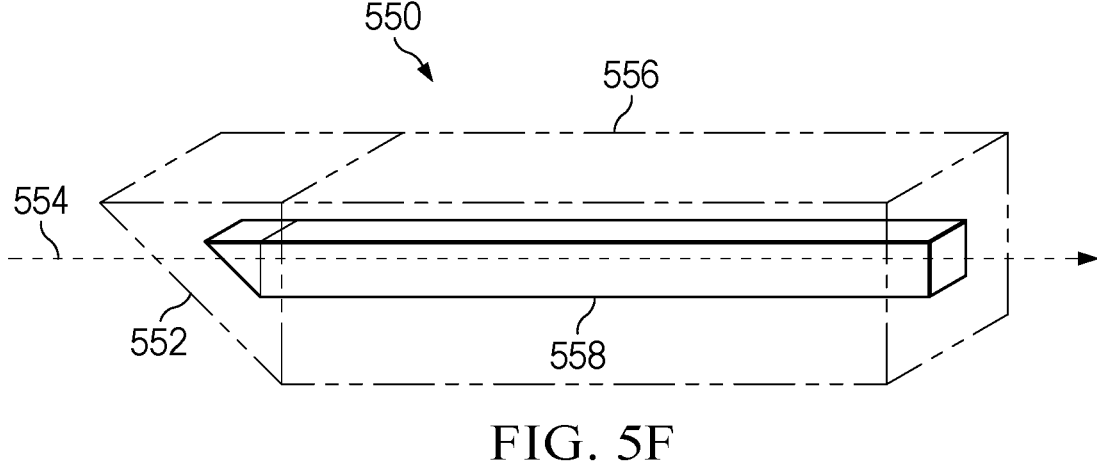
Figure 5G:
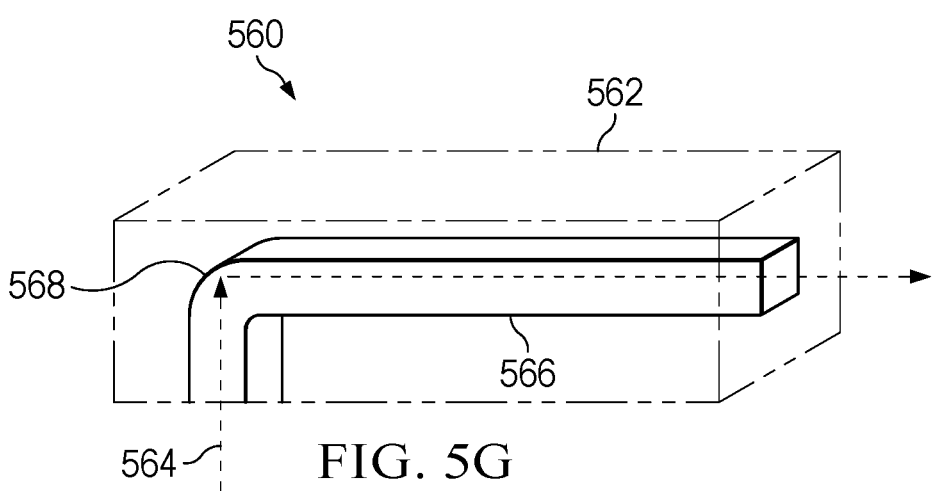
Figure 5H:
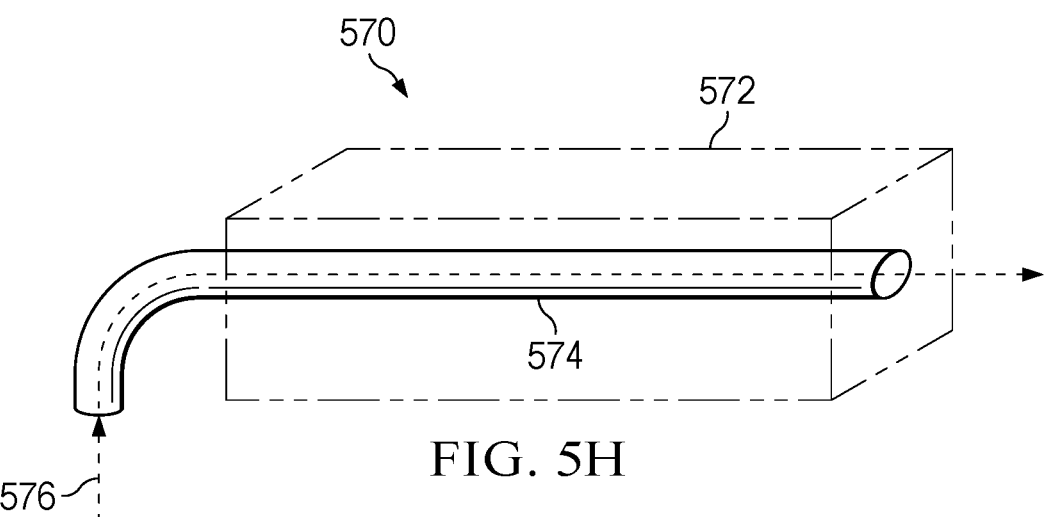

FIG. 5F illustrates a light guide 550 with a rod 558 centered in an integrator rod 556. Light 554 enters the light guide 550 at an angled surface 552. In an example, the rod 558 is a solid rod and the integrator rod 556 is a hollow rod. Light experiences refraction upon be coupled to the rod 558, and the integrator rod 556 does not change the angle of light entering. Accordingly, light entering the integrator rod 556 may have a different angle than the light entering the rod 558. The rod 558 has modes for light from one or a few laser sources for low luminescence and a small point spread function in the far field. The portions of the integrator rod 556 around the rod 558 has modes for light from many lasers for large luminescence and a large point spread function in the far field. FIG. 5G illustrates a light guide 560 with an integrator rod 562 around a rod 566. The rod 566 contains a bend 568. Light 564 from one or a few lasers enters the rod 566 at the bottom and propagates through the bend for a low luminance and small point spread function in the far field. Light from many lasers propagates through the integrator rod 562 for a high luminescence and a small point spread function in the far field. FIG. 5H illustrates a light guide 570 with an optical fiber 574 in an integrator rod 572. Light 576 from one or a few lasers enters and propagates through the optical fiber 574 for a relatively low luminescence and a small point spread function in the far field. Light from many lasers enters and propagates through the integrator rod 572 with a high luminescence and large point spread function in the far field.

Figure 5I:
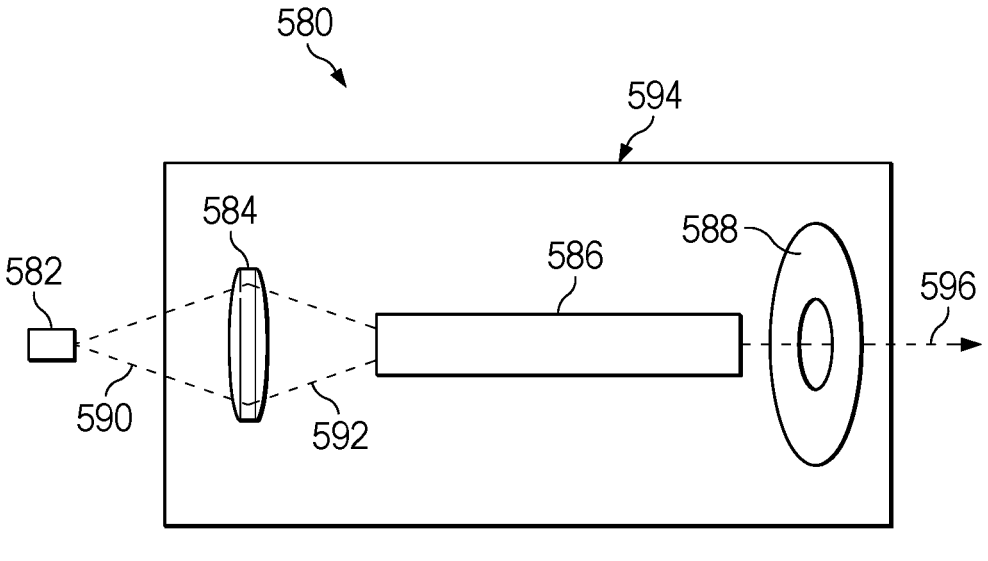

FIG. 5I illustrates an example laser light source 580, which may be an example of the laser light source 102 illustrated in FIG. 1A, the laser light source 122 illustrated in FIG. 1B, the laser light source 172 illustrated in FIG. 1C, the laser light source 214 illustrated in FIG. 2A, or the laser light source 314 illustrated in FIG. 3. The laser light source 580 includes at least one laser 582 and an optical element 594 optically coupled to the at least one laser 582. The at least one laser 582 may be an example of the at least one laser 202 illustrated in FIG. 2A or the at least one laser 302 in FIG. 3. The at least one laser 582 may be a single laser diode, multiple lasers, or a laser array, which may be an array of multi-mode laser diodes. The optical element 594 may be an example of the optical element 204 illustrated in FIG. 2A or the optical waveguide 304 illustrated in FIG. 3. The optical element 594 contains a lens 584, an integrator rod 586, and a variable size aperture 588. The at least one laser 582 produces laser light 590. The lens 584 focuses the laser light 592 to enter the integrator rod 586. The integrator rod 586 is optically coupled to the lens 584 and to the variable size aperture 588 The variable size aperture 588 controls the amount of the shaped light 596 exiting the integrator rod 586. When the variable size aperture 588 is fully open, it allows more light to exit the integrator rod 586 as the shaped light 596, for a higher luminescence and a larger point spread function in the far field. When the variable size aperture 588 is partially closed, it allows less of the shaped light 596 to exit the integrator rod 586 for a lower luminescence and a smaller point spread function in the far field. The phase of the shaped light 596 may be modulated by an OPM, for example the OPM 206 illustrated in FIG. 2A or the OPM 306 illustrated in FIG. 3.

Figure 6A:
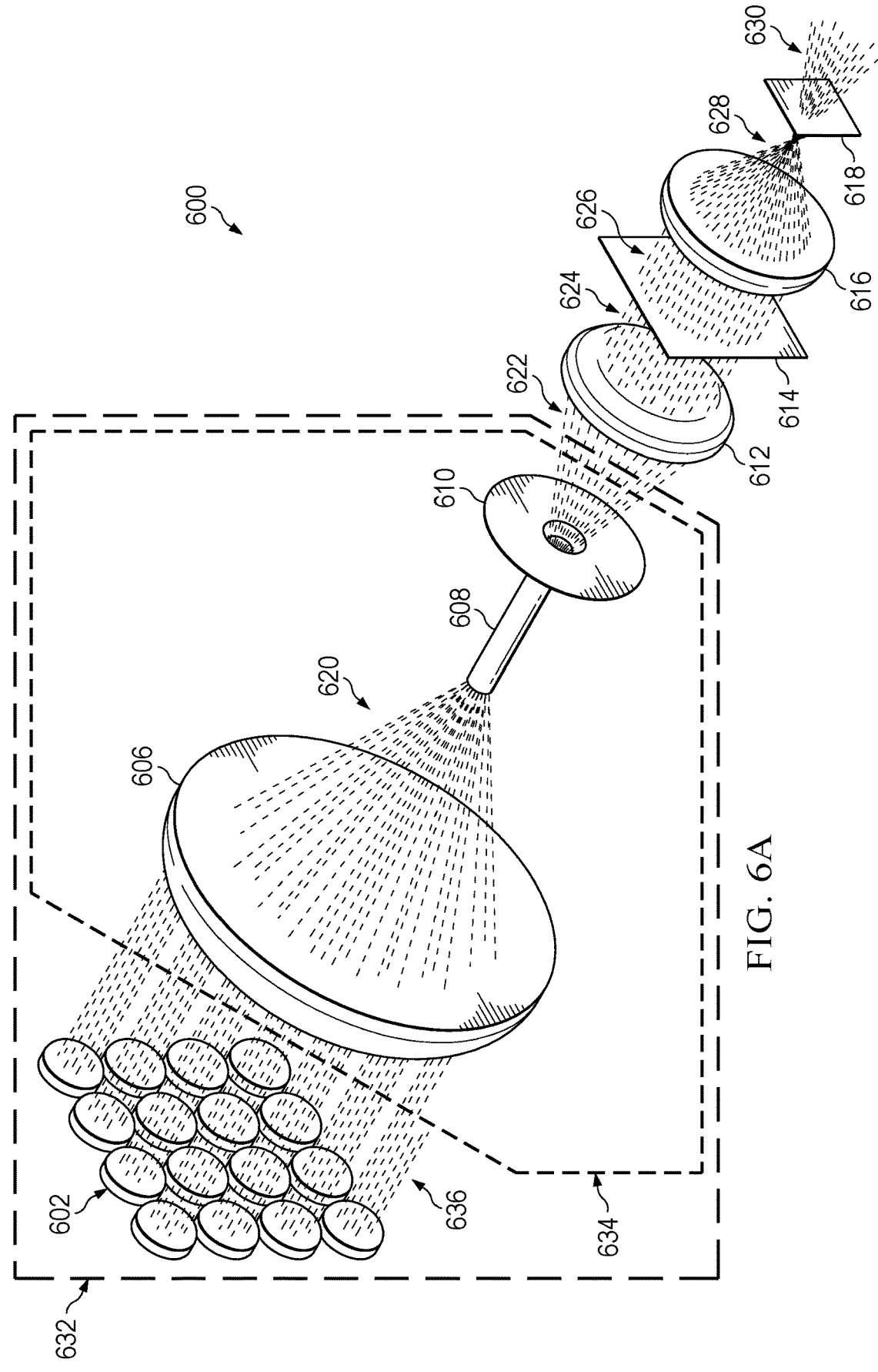
FIG. 6A illustrates an example optical projection system and FIGS. 6B-C illustrate point spread functions in the far field of an example optical projection system.
Figure 6B:
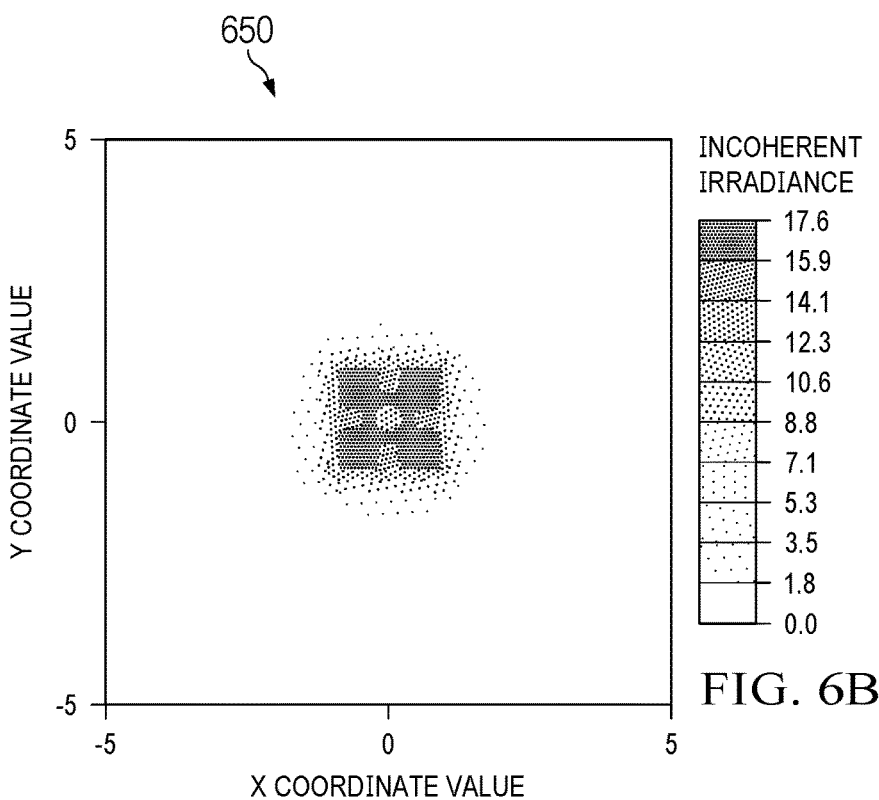
Figure 6C:
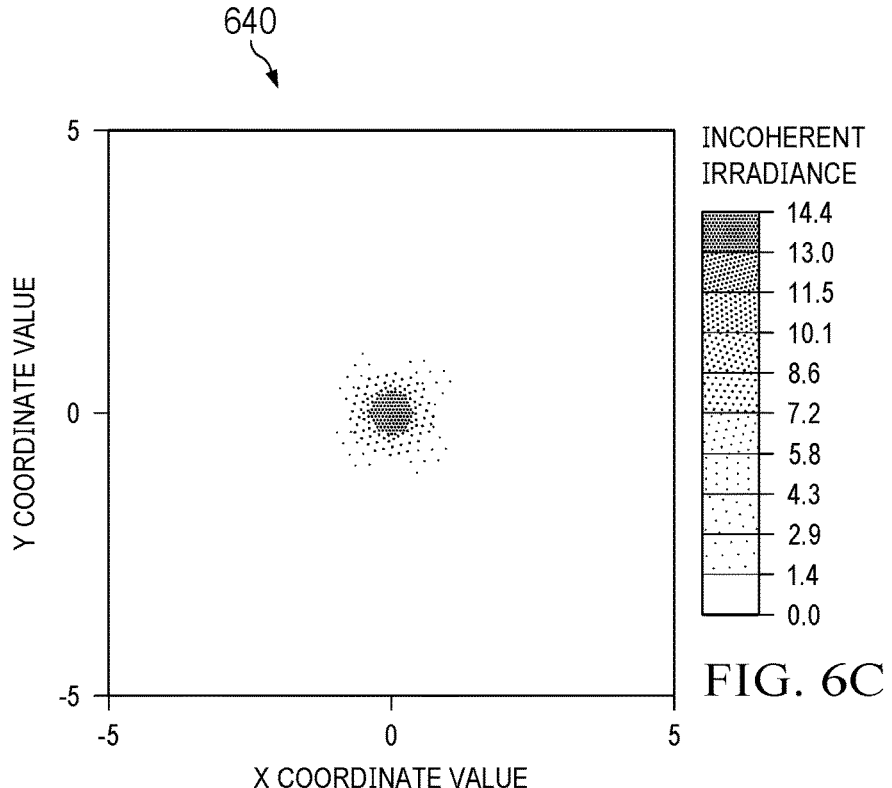

FIG. 6A illustrates an optical projection system 600 and FIGS. 6B-C illustrate point spread functions 650 and 640, respectively, in the far field of the optical projection system 600. The optical projection system 600 includes the laser light source 632, which may be an example of the laser light source 102 illustrated in FIG. 1A, the laser light source 122 illustrated in FIG. 1B, the laser light source 172 illustrated in FIG. 1C, the laser light source 214 illustrated in FIG. 2A, or the laser light source 314 illustrated in FIG. 3. The laser light source 632 includes a laser array 602 and an optical element 634 optically coupled to the laser array 602. The laser array 602 may be an example of the at least one laser 202 illustrated in FIG. 2A or the at least one laser 302 illustrated in FIG. 3. In an example, the laser array 602 has four rows and five columns of laser diodes, which may be multi-mode laser diodes. In other examples, the laser array 602 may have a different number of rows and a different number of columns. For example, the laser array 602 may have two, three, four, or six columns and may have two, three, five, or six columns.

The optical element 634 may be an example of the optical element 204 illustrated in FIG. 2A or the optical waveguide 304 illustrated in FIG. 3. The optical element 634 includes a focusing lens 606, an integrator rod 608 optically coupled to the focusing lens 606, and a variable size aperture 610 optically coupled to the integrator rod 608. The laser array 602 produces laser light 636. The focusing lens 606, which is optically coupled to the laser array 602, focuses the laser light 636 as focused light 620 to enter the integrator rod 608. The integrator rod 608 homogenizes the focused light 620. The variable size aperture 610 adjusts the amount of shaped light 622 exiting the optical element 634. When the variable size aperture 610 is open, more light exits the optical element 634 for a higher luminescence and a larger point spread function in the far field. When the variable sized aperture is partially closed, less light exits the optical element 634 as shaped light 622 for a lower luminescence and a smaller point spread function in the far field. The shaped light 622 is focused by a lens 612 as light 624 towards an OPM 614. The OPM 614 may be an example of the OPM 104 illustrated in FIG. 1A, the OPM 124 illustrated in FIG. 1B, the OPM 174 illustrated in FIG. 1C, the OPM 206 illustrated in FIG. 2A, or the OPM 306 illustrated in in FIG. 3. The OPM 614 may be a PLM, a phase-only LCOS device, or a deformable mirror device. In FIG. 6A the OPM 614 is illustrated as a transmissive OPM for clarity of illustration, but the OPM 614 may be a reflective OPM. The OPM 614 produces modulated light 626 by modulating the phase of the light 624 to produce a hologram in the far field.

A Fourier lens 616, which is optically coupled to the OPM 614, focuses the light 626 as light 628 to produce an image at the image plane 618. Past the image plane 618 is light 630. In other examples, a Fresnel configuration is used, and a spherical wavefront is built into the hologram of the OPM 614. In this example, the OPM 614 acts as a lens, and the Fourier lens 616 is not used. FIG. 6B illustrates a point spread function 650 at the image plane 618 when the variable size aperture 610 is open. FIG. 6C illustrates a point spread function 640 at the image plane 618 when the variable size aperture 610 is partially closed. The point spread function 640 is smaller than the point spread function 650.

Figure 7A:
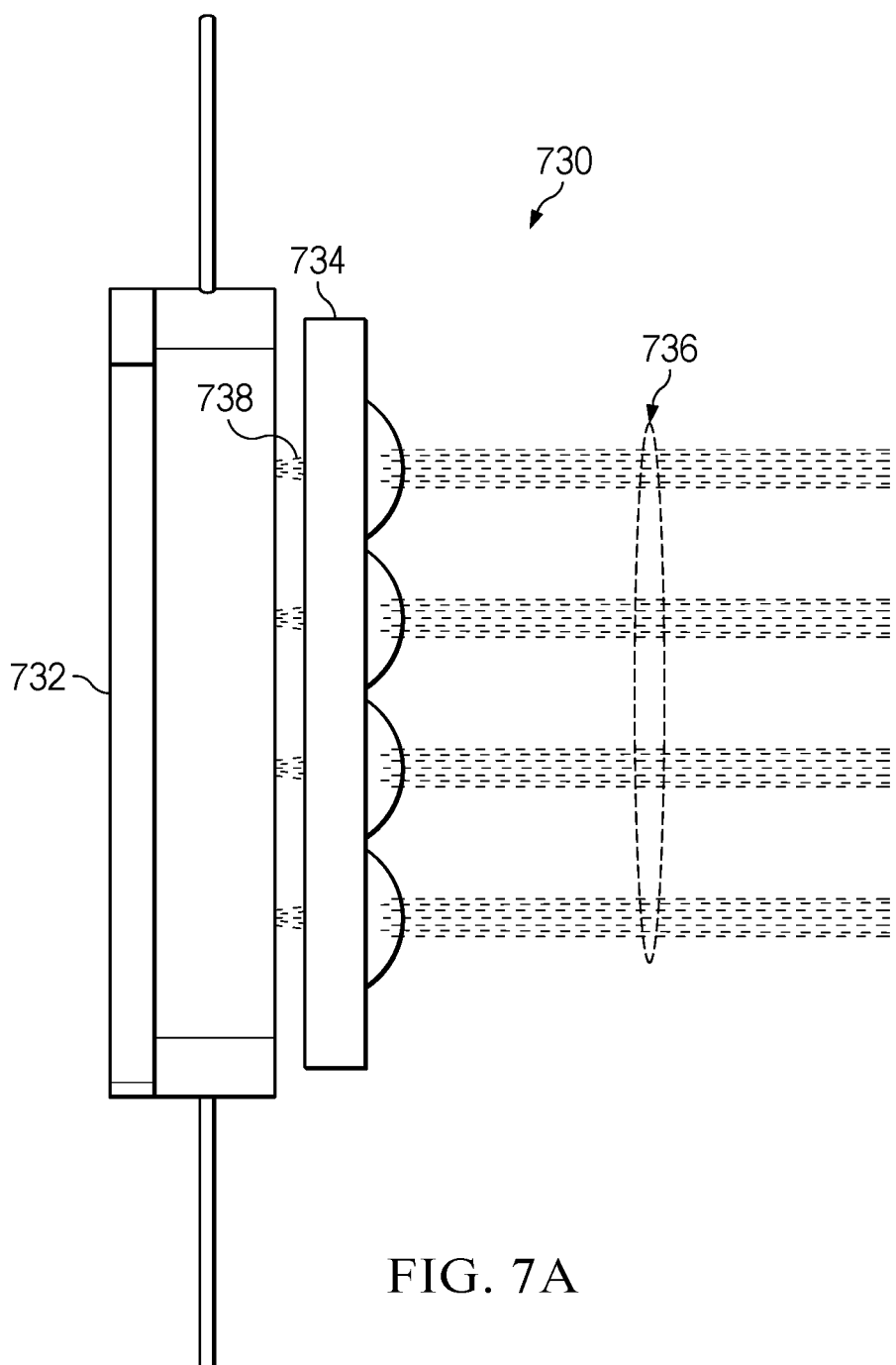
FIG. 7A illustrates a laser light source.
Figure 7B:
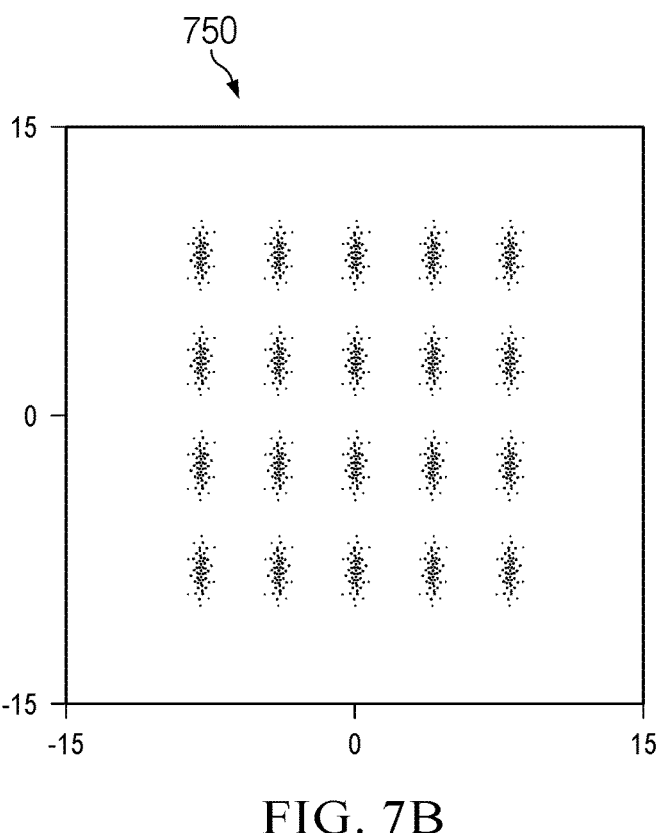
FIG. 7B illustrates a laser beam footprint for a laser light source.
Figure 7C:
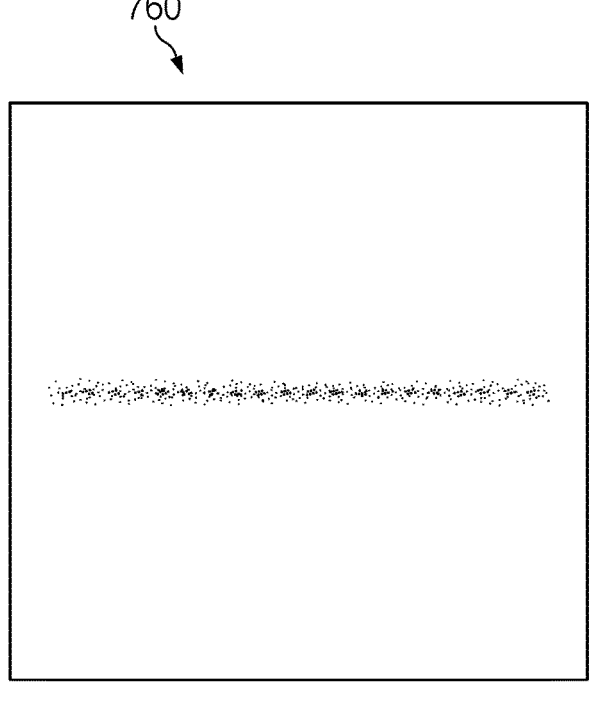
FIG. 7C illustrates a point spread function in the far field for an example laser light source.

FIG. 7A illustrates a laser light source 730, FIG. 7B illustrates a laser beam footprint 750 for the laser light source 730, and FIG. 7C illustrates a point spread function 760 for the laser light source 730 in the far field. FIG. 7A illustrates the laser light source 730 which contains a laser array 732. In an example, the laser array 732 has four rows and five columns of laser diodes, for example multi-mode laser diodes. In other examples, the laser array 732 may have a different number of rows and a different number of columns. For example, the laser array 732 may have two, three, four, or six columns and may have two, three, five, or six columns. The laser array 732 produces laser light 738. A lens array 734, optically coupled to the laser array 732, produces light 736 by collimating the laser light 738 along the fast-axis and partially collimating the laser light 738 along the slow-axis. The lenses of the lens array 734 are rotationally symmetric and aspheric, primarily collimating along the fast-axis. In another example, the lenses of the lens array 734 are not rotationally symmetric, and both the fast-axis and the slow-axis are collimated. Due to the short focal length the point spread function of the light 736 in the far field is large. FIG. 7B illustrates the laser beam footprint 750 for the light 736. FIG. 7C illustrates the point spread function 760 for the light 736 in the far field.

Figure 8A:
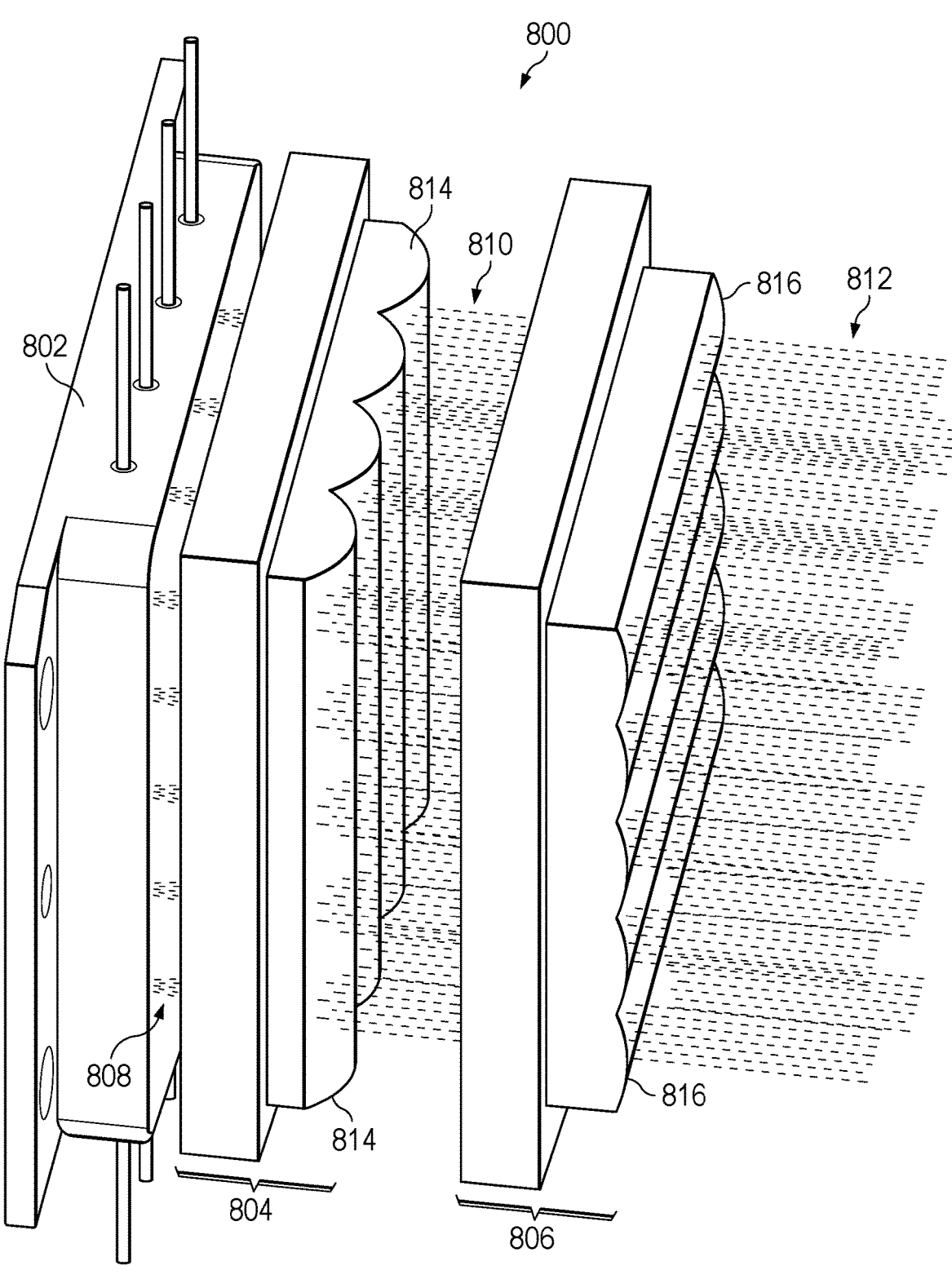
FIG. 8A illustrates an example laser light source.
Figure 8B:
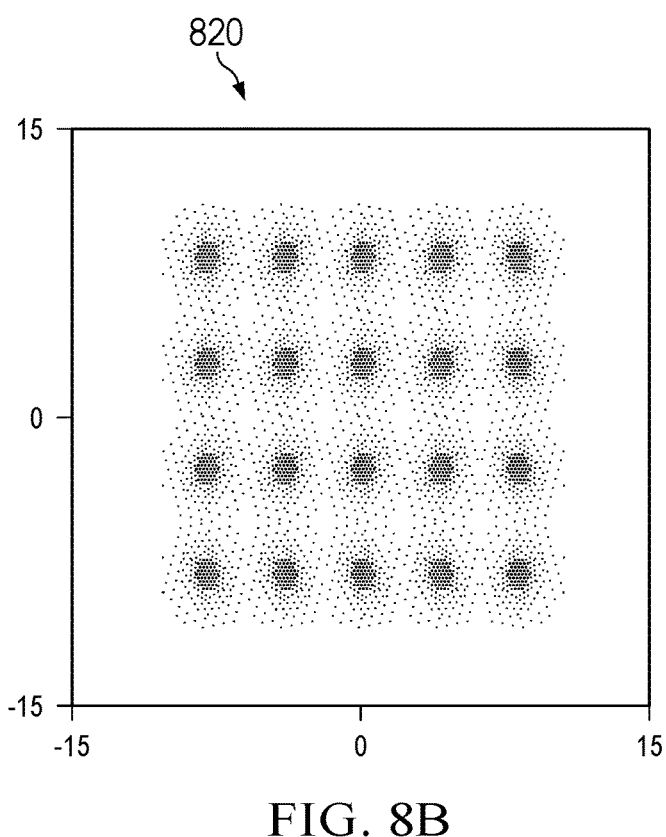
FIG. 8B illustrates a laser beam footprint for an example laser light source.
Figure 8C:
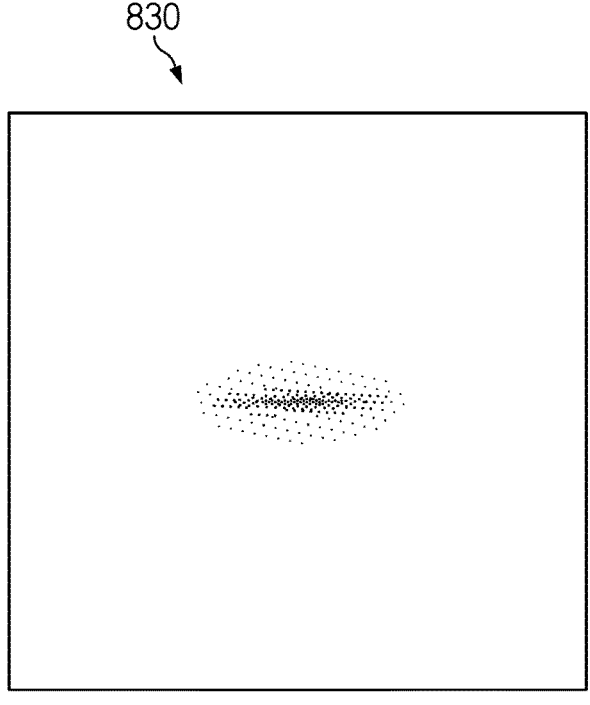
FIG. 8C illustrates a point spread function in the far field for an example laser light source.
Figure 8D:
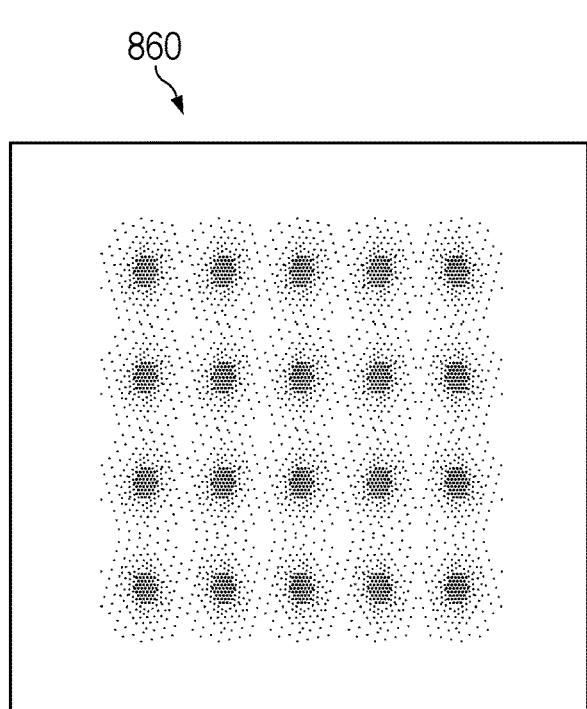
FIG. 8D illustrates another laser beam footprint for an example laser light source.
Figure 8E:
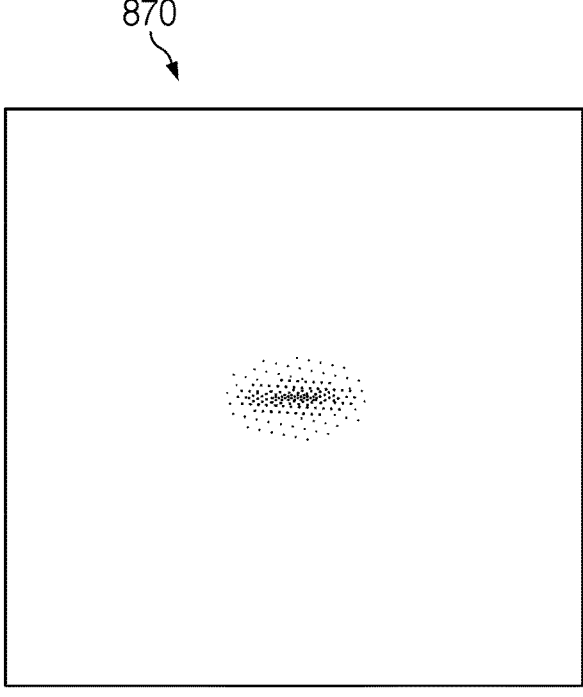
FIG. 8E illustrates another point spread function in the far field for an example laser light source.

FIG. 8A illustrates a laser light source 800, FIG. 8B illustrates a laser beam footprint 820 for the laser light source 800, FIG. 8C illustrates the point spread function 830 for the laser light source 800 in the far field, FIG. 8D illustrates a laser beam footprint 860 for the laser light source 800 light source, and FIG. 8E illustrates a point spread function 870 for the laser light source 800 in the far field. The laser light source 800 may be an example of the laser light source 102 illustrated in FIG. 1A, the laser light source 122 illustrated in FIG. 1B, the laser light source 172 illustrated in FIG. 1C, or the laser light source 214 illustrated in FIG. 2A. The laser light source 800 includes a laser array 802, a fast-axis collimator (FAC) lens 804 optically coupled to the laser array 802, and a slow-axis collimator (SAC) lens 806 optically coupled to the FAC lens 804. In an example, the laser array 802 has five rows and four columns of lasers, which may be multi-mode laser diodes. In other examples, the laser array 802 may have a different number of rows and a different number of columns of lasers. For example, the laser array 802 may have two, three, five, or six columns and may have two, three, four, or six columns. The laser array 802 may be an example of the at least one laser 202 illustrated in FIG. 2A. The FAC lens 804 and the SAC lens 806 may be an example of the optical element 204 illustrated in FIG. 2A. The laser array 802 produces laser light 808.

The FAC lens 804 collimates the laser light 808 along the fast-axis to produce light 810. The FAC lens 804 contains a cylindrical portion with cylindrical surfaces 814. In FIG. 8A, the four cylindrical surfaces 814 correspond to the four columns of the laser array 802. In an example, the FAC lens 804 has a 5.7 mm focal length. In other examples, the FAC lens 804 has a different focal length. The SAC lens 806 collimates the light 810 along the slow-axis to produce shaped light 812. Because the fast-axis divergence is larger than the slow-axis divergence, the FAC lens 804 has a shorter focal length than the SAC lens 806, and/or the FAC lens 804 is closer to the laser array 802 than the SAC lens 806 is to the laser array 802. As pictured, the FAC lens 804 is closer to the laser array 802 than the SAC lens 806 is, but in other examples the SAC lens 806 is before the FAC lens 804. The SAC lens 806 contains cylindrical portions with cylindrical surfaces 816. The SAC lens 806 has five cylindrical surfaces 816, corresponding the five rows of lasers in the laser array 802. The cylindrical surfaces 816 of the SAC are perpendicular to the cylindrical surfaces of the FAC lens 804. The SAC lens 806, in an example, has a focal length of 14.0 mm. In another example, the SAC lens 806 has a focal length of 20.0 mm. In other examples, the SAC lens 806 has a different focal length. The phase of the shaped light 812 may be modulated by an OPM, for example the OPM 206 illustrated in FIG. 2A.

FIG. 8B illustrates the laser beam footprint 820 for the shaped light 812 in an example where the FAC lens 804 has a focal length of 5.7 mm and the SAC lens 806 has a focal length of 14.0 mm. FIG. 8C illustrates the point spread function 830 for the shaped light 812 in the far field in an example where the FAC lens 804 has a focal length of 5.7 mm and the SAC lens 806 has a focal length of 14.0 mm. FIG. 8D illustrates the laser beam footprint 860 for the shaped light 812 in an example where the FAC lens 804 has a focal length of 5.7 mm and the SAC lens 806 has a focal length of 20.0 mm. FIG. 8E illustrates the point spread function 870 for the shaped light 812 in the far field in an example where the FAC lens 804 has a focal length of 5.7 mm and the SAC lens 806 has a focal length of 20.0 mm. Both the example where the FAC lens 804 has a focal length of 5.7 mm and the example where the FAC lens 804 has a focal length of 5.7 mm and the SAC lens 806 has a focal length of 14.0, compared to the example with the lens array 734, have a reduced point spread function in the far field while retaining the laser beam footprint. The example where the FAC lens 804 has a focal length of 5.7 mm and the SAC lens 806 has a focal length of 20.0 has a smaller point spread function 830 than the point spread function 870 in the far field for the example where the FAC lens 804 has a focal length of 5.7 mm and the SAC lens 806 has a focal length of 14.0.

Figure 9:
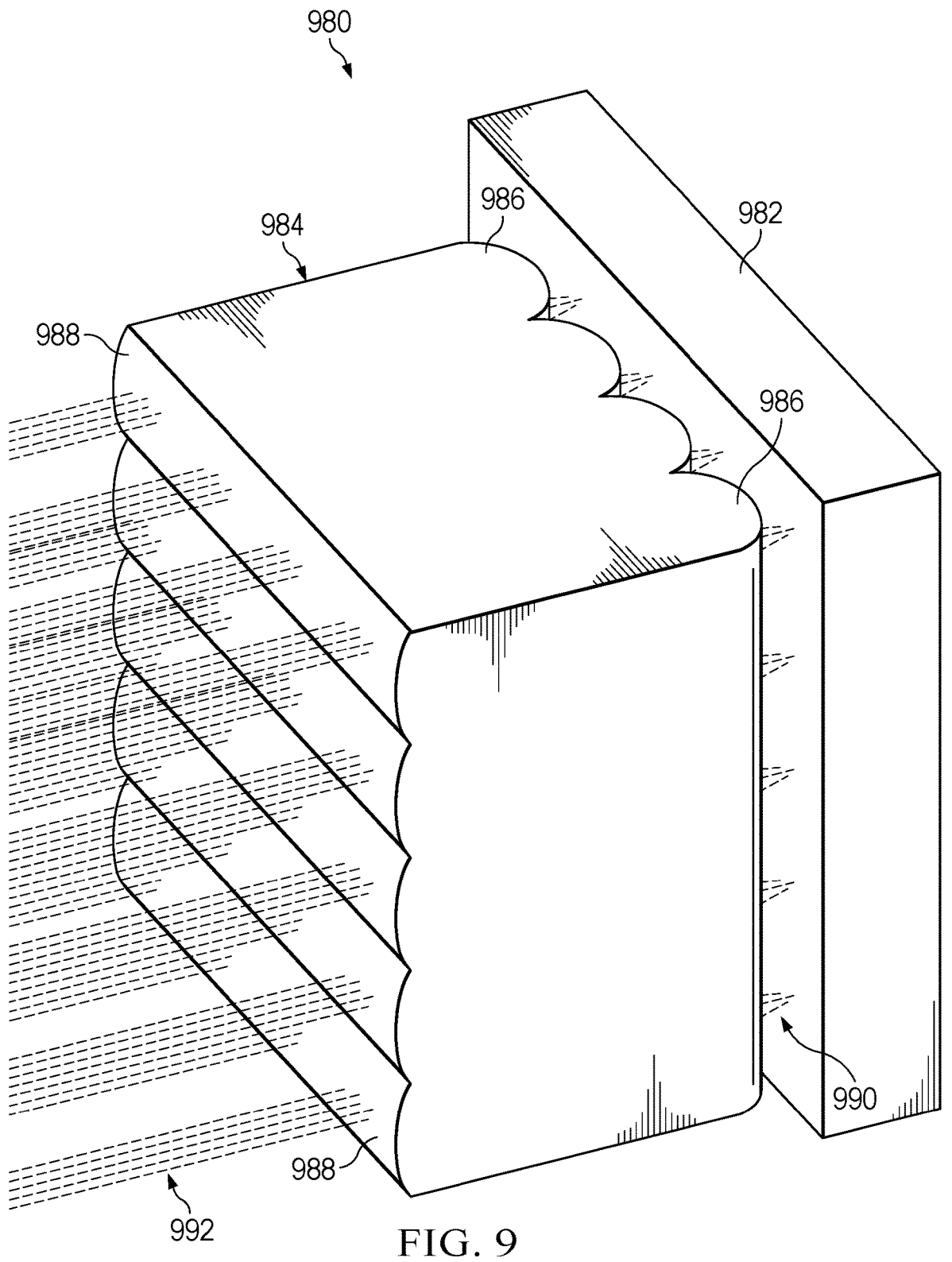
FIG. 9 illustrates an additional example laser light source.

FIG. 9 illustrates a laser light source 980 with a dual sided collimator array 984 which performs both fast-axis collimation and slow-axis collimation. The laser light source 980 may be an example of the laser light source 102 illustrated in FIG. 1A, the laser light source 122 illustrated in FIG. 1B, the laser light source 172 illustrated in FIG. 1C, or the laser light source 214 illustrated in FIG. 2A. The laser light source 980 contains a laser array 982, which may be an example of the at least one laser 202 illustrated in FIG. 2A. In an example, the laser array 982 has five rows and four columns of lasers, which may be multi-mode laser diodes. In other examples, the laser array 982 may have a different number of rows and a different number of columns of lasers. For example, the laser array 982 has two, three, five, or six columns and may have two, three, four, or six columns. The laser array 982 produces the laser light 990. The dual sided collimator array 984 is optically coupled to the laser array 982. The dual sided collimator array 984 may be an example of the optical element 204 illustrated in FIG. 2A. The dual sided collimator array 984 produces shaped light 992 based on receiving the laser light 990. In an example, the point spread function of the shaped light 992 in the far field is smaller than the point spread function 760 in the far field for the light 736 illustrated in FIGS. 7A-B. The dual sided collimator array 984 has cylindrical portions 986 and cylindrical portions 988, which are approximately perpendicular to the cylindrical portions 986. The cylindrical portions 986 of the dual sided collimator array 984 form an FAC lens and the cylindrical portions 988 form a SAC lens. In an example, there is one cylindrical portion 986 corresponding to each column of the laser array 982, and there is one cylindrical portion 988 corresponding to each row of the laser array 982. The phase of the shaped light 992 may be modulated by an OPM, for example the OPM 206 illustrated in FIG. 2A.

Figure 10A:
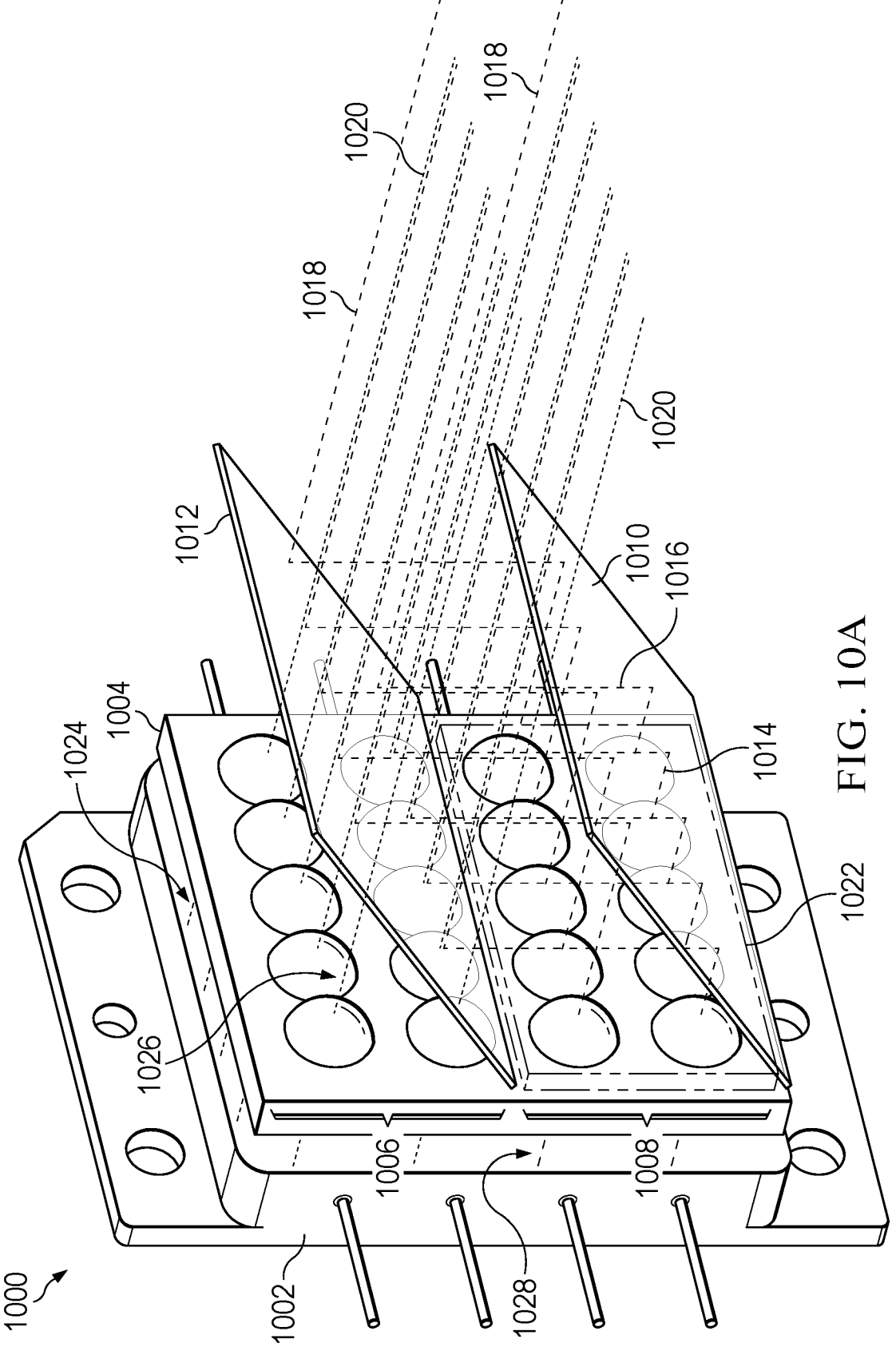
FIG. 10A illustrates an example light source.
Figure 10B:
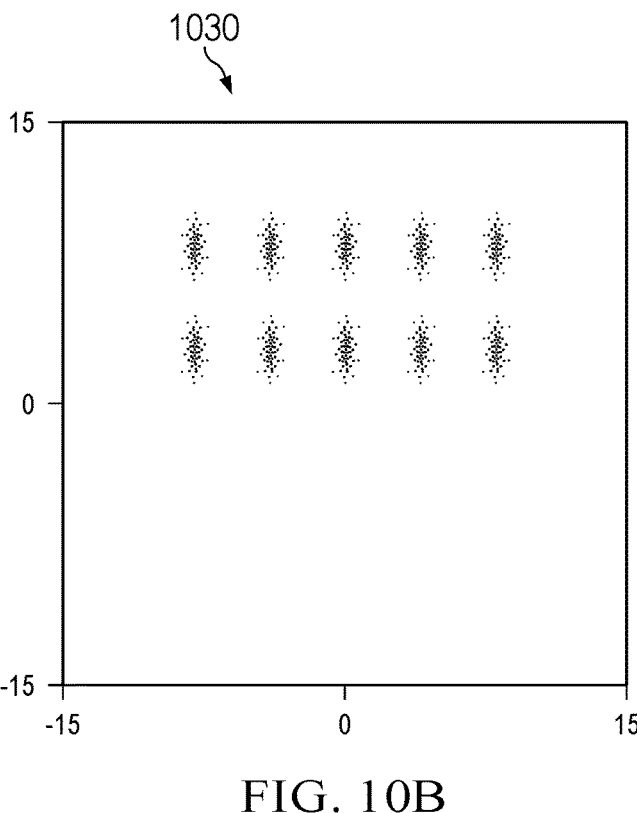
FIG. 10B illustrates a laser beam footprint for an example light source.
Figure 10C:
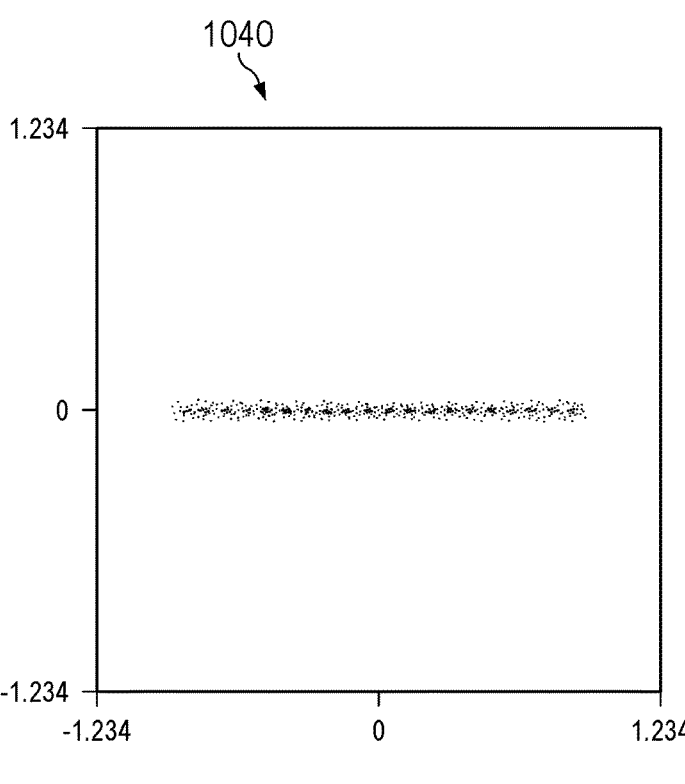
FIG. 10C illustrates an example point spread function in the far field for an example light source.
Figure 10D:
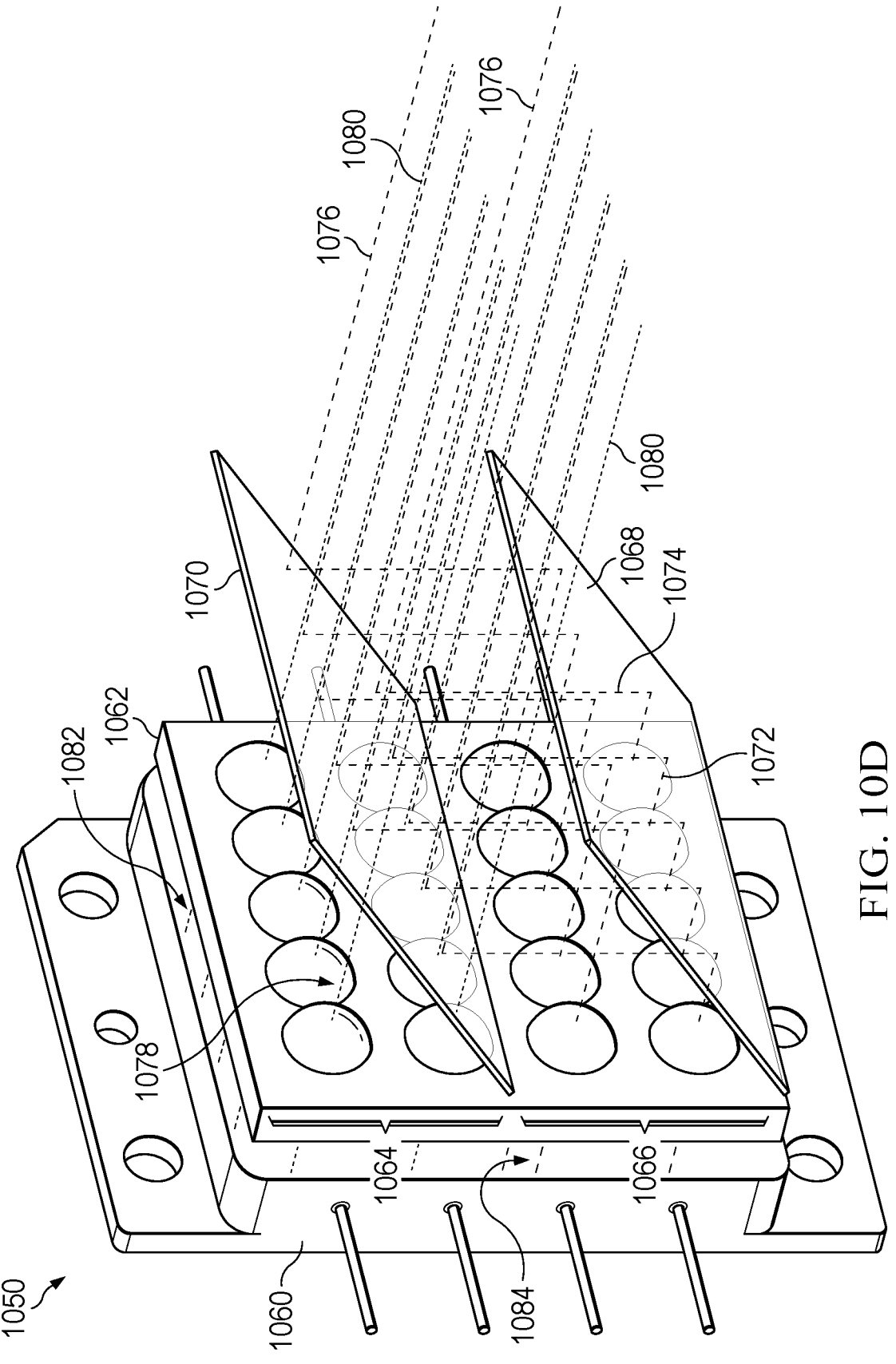
FIG. 10D illustrates another example light source.

FIG. 10A illustrates a laser light source 1000, FIG. 10B illustrates a laser beam footprint 1030 for the laser light source 1000, FIG. 10C illustrates a point spread function 1040 in the far field for the laser light source 1000, and FIG. 10D illustrates a laser light source 1050. FIG. 10A illustrates the laser light source 1000, which may be an example of the laser light source 102 illustrated in FIG. 1A, the laser light source 122 illustrated in FIG. 1B, the laser light source 172 illustrated in FIG. 1C, or the laser light source 214 illustrated in FIG. 2A. The laser light source 1000 contains a laser array 1002, which may be an example of the at least one laser 202 illustrated in FIG. 2A. In an example, the laser array 1002 has four rows and five columns of lasers, which may be multi-mode laser diodes. In other examples, the laser array 1002 may have a different number of rows and a different number of columns of lasers. For example, the laser array 1002 may have two, three, five, or six columns and may have two, three, four, or six columns. The laser array 1002 has first rows of lasers 1006 and second rows of lasers 1008. The first rows of lasers 1006 produces laser light 1024 and the second rows of lasers 1008 produces the light 1028, having a first polarization. In the illustrated example, both the first rows of lasers 1006 and the second rows of lasers 1008 contain two rows of lasers. In other examples, the first rows of lasers 1006 and the second rows of lasers 1008 may have different numbers of rows, for example one row or three rows. In additional examples, the first rows of lasers 1006 has a different number of rows of lasers than the second rows of lasers 1008.

The lens array 1004, the half waveplate 1022, the mirror 1010, and the PBS 1012 may be an example of the optical element 204 illustrated in FIG. 2A. The lens array 1004, optically coupled to the laser array 1002, collimates the laser light 1024 along the fast-axis and partially collimates the laser light 1024 along the slow-axis. The half waveplate 1022 is optically coupled to the second rows of lasers 1008. The half waveplate 1022 shifts the phase of the portion of the laser light 1024 from the second rows of lasers 1008 by 180 degrees to produce phase shifted light 1014 having a second polarization different than the first polarization. The mirror 1010 is optically coupled to the half waveplate 1022. The mirror 1010 reflects the phase shifted light 1014 to produce reflected light 1016. The PBS 1012 is an example of an optical combining element that transmits or reflects light based on a characteristic, where the characteristic is polarization. The PBS 1012 may be a plate, a cube, or a wire-grid polarizer. The PBS 1012 is optically coupled to the mirror 1010 and to the first rows of lasers 1006. The PBS 1012 transmits the portion of the laser light 1024 from the first rows of lasers 1006 having the first polarization as a first portion of shaped light 1020. The PBS 1012 transmits the laser light 1024 having the first polarization to produce a first portion of shaped light 1020. The PBS 1012 reflects the reflected light 1016 which has the second polarization, to produce a second portion of shaped light 1018. The PBS 1012 combines the first portion of shaped light 1020 and the second portion of shaped light 1018. The first portion of shaped light 1020 originates from the first rows of lasers 1006 and the second portion of shaped light 1018 originates from the second rows of lasers 1008. The phase of the first portion of shaped light 1020 and the second portion of shaped light 1018 may be modulated by an OPM, for example the OPM 206 illustrated in FIG. 2A, to produce a hologram in the far field.

FIG. 10B illustrates laser beam footprint 1030 for the laser light containing the first portion of shaped light 1020 and the second portion of shaped light 1018. The Etendue of the laser light is reduced by about 50% compared to the laser beam footprint 750 illustrated by FIG. 7B. The laser beam footprint 1030 may be shifted to the center of the optical axis by shifting the location where the laser array 1002 is mounted to align the optical beam containing the first portion of shaped light 1020 and the second portion of shaped light 1018 is aligned with the center of the OPM. FIG. 10C illustrates the point spread function 1040 in the far field for the laser light containing the first portion of shaped light 1020 and the second portion of shaped light 1018. The point spread function 1040 is smaller compared to the point spread function 760 illustrated in FIG. 7C. The smaller Etendue allows more beam expansion to illuminate an OPM, which would further reduce the point spread function in the far field.

FIG. 10D illustrates the laser light source 1050, which may be an example of the laser light source 102 illustrated in FIG. 1A, the laser light source 122 illustrated in FIG. 1B, the laser light source 172 illustrated in FIG. 1C, or the laser light source 214 illustrated in FIG. 2A. The laser light source 1050 contains a laser array 1060, a lens array 1062 optically coupled to the laser array 1060, a mirror 1068 optically coupled to the second rows of lasers 1066 of the laser array 1060, and a dichroic mirror 1070 optically coupled to the first rows of lasers 1064 of the laser array 1060 and to the mirror 1068. The laser array 1060 may be an example of the at least one laser 202 illustrated in FIG. 2A. In an example, the laser array 1060 has five rows and four columns of lasers, which may be multi-mode laser diodes. In other examples, the laser array 1060 may have a different number of rows and a different number of columns. For example, the laser array 1060 may have two, three, four, or six columns and may have two, three, five, or six columns. The laser array 1060 contains first rows of lasers 1064 and second rows of lasers 1066. In the illustrated example, the first rows of lasers 1064 and the second rows of lasers 1066 each have two rows, but they may have a different number of rows, for example one row or three rows. In some examples, the first rows of lasers 1064 has a different number of rows than the second rows of lasers 1066. In an example, the first rows of lasers 1064 produce a first portion of laser light 1082 having a first wavelength, for example 642 nm, and the second rows of lasers 1066 produce a second portion of laser light 1084 having a second wavelength different from the first wavelength, for example 638 nm. In other examples, the first wavelength and the second wavelength may be other wavelengths.

The lens array 1062, mirror 1068, and dichroic mirror 1070 may be an example of optical element 204 illustrated in FIG. 2A. The lens array 1062, which contains a lens corresponding to each laser of the laser array 1060, partially collimates the first portion of laser light 1082 and the second portion of laser light 1084 primarily along the fast-axis to produce a first portion of collimated light 1078 and a second portion of collimated light 1072, respectively. The first portion of collimated light 1078 originates from the first rows of lasers 1064 and the second portion of collimated light 1072 originates from the second rows of lasers 1066. The mirror 1068 is optically coupled to the second rows of lasers 1066. The mirror 1068 reflects the second portion of collimated light 1072 as reflected light 1074. The dichroic mirror 1070 is an example of an optical combining element configured to transmit or reflect light based on a characteristic, where the characteristic is wavelength. The dichroic mirror 1070 is optically coupled to the mirror 1068 and to the first rows of lasers 1064. In an example, the dichroic mirror 1070 is a laser-line filter with sharp cut-on and cut-off wavelengths. The dichroic mirror 1070 transmits the first portion of collimated light 1078 having the first wavelength as a first portion of shaped light 1080.

Also, the dichroic mirror 1070 reflects the reflected light 1074 having the second wavelength as a second portion of shaped light 1076. The first portion of shaped light 1080 originates from the first rows of lasers 1064 and the second portion of shaped light 1076 originates from the second rows of lasers 1066. The phase of the shaped light 1080 may be modulated by an OPM, for example the OPM 206 illustrated in FIG. 2A, to produce a hologram in the far field. The first portion of shaped light 1080 and the second portion of shaped light 1076 have a point spread function in the far field that is less than the point spread function 760 illustrated in FIG. 7C.

Figure 11A:
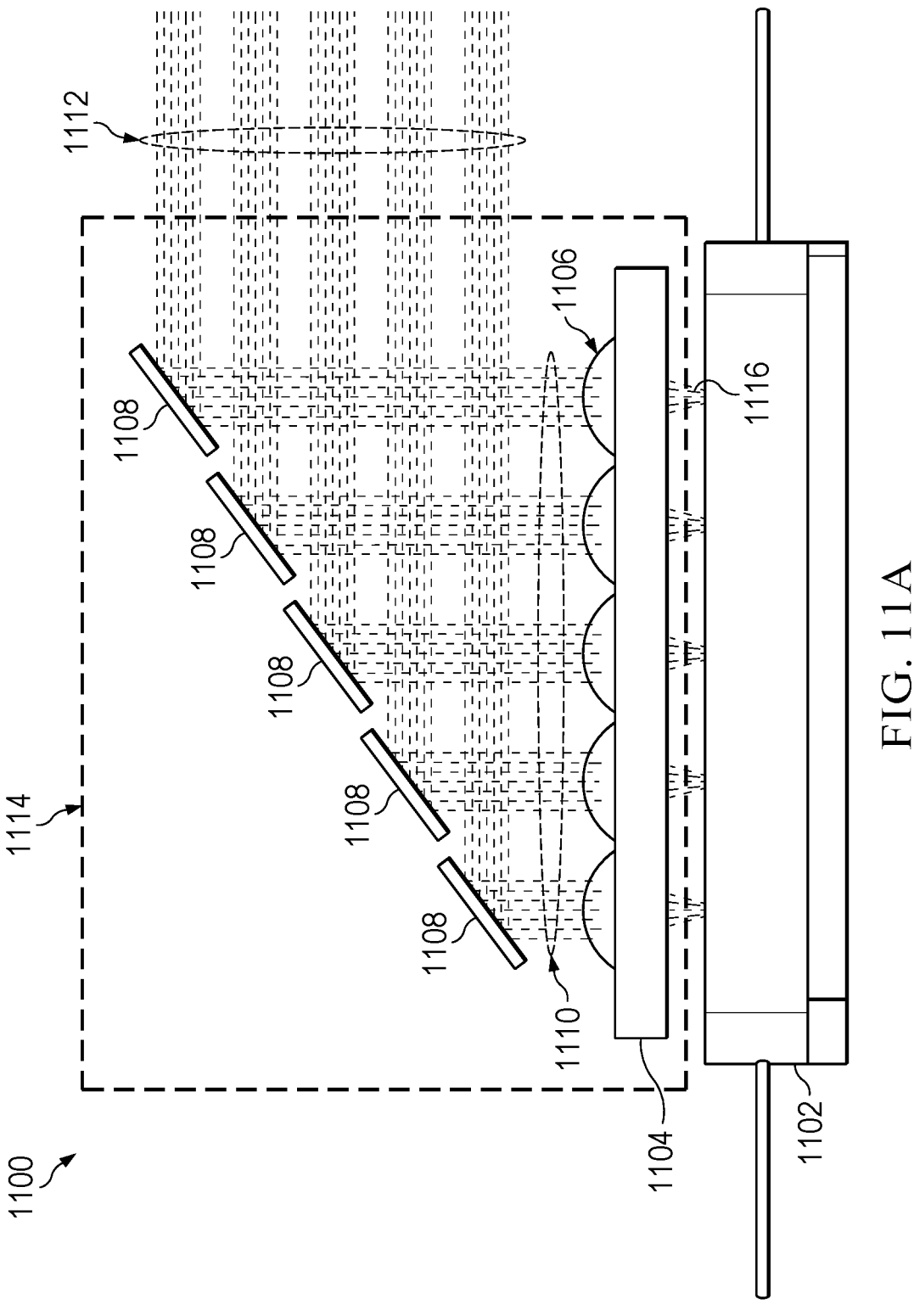
FIG. 11A illustrates an example laser light source.
Figure 11B:
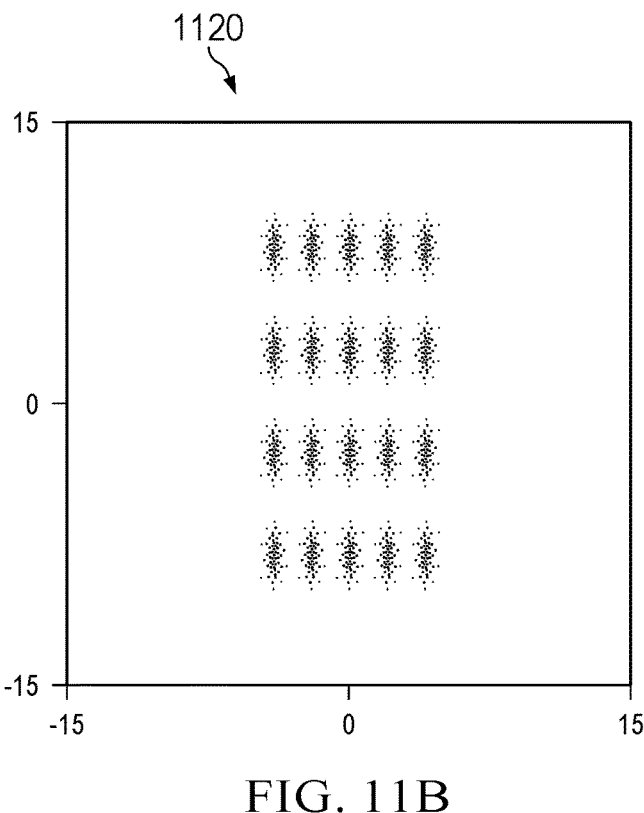
FIG. 11B illustrates a laser beam footprint for an example laser light source.
Figure 11C:
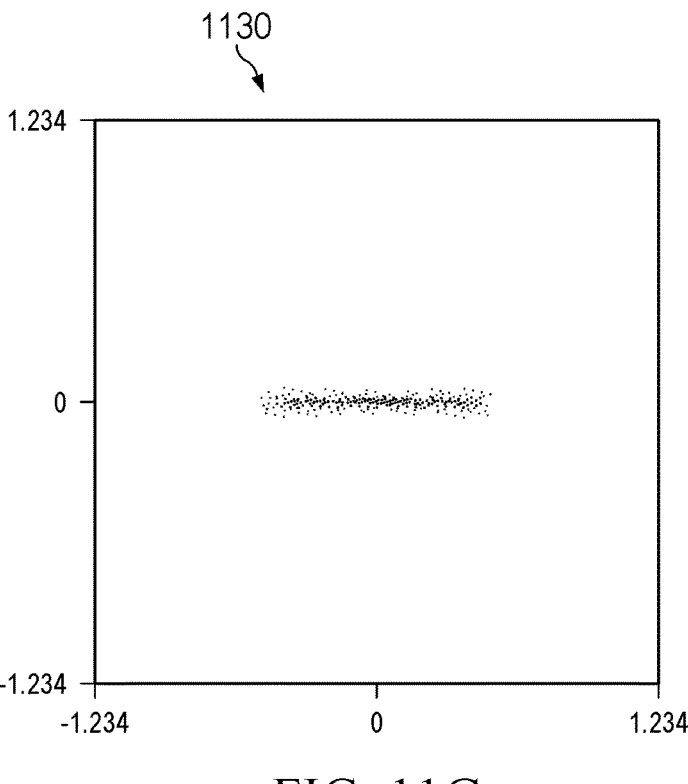
FIG. 11C illustrates a point spread function in the far field for an example light source.
Figure 11D:
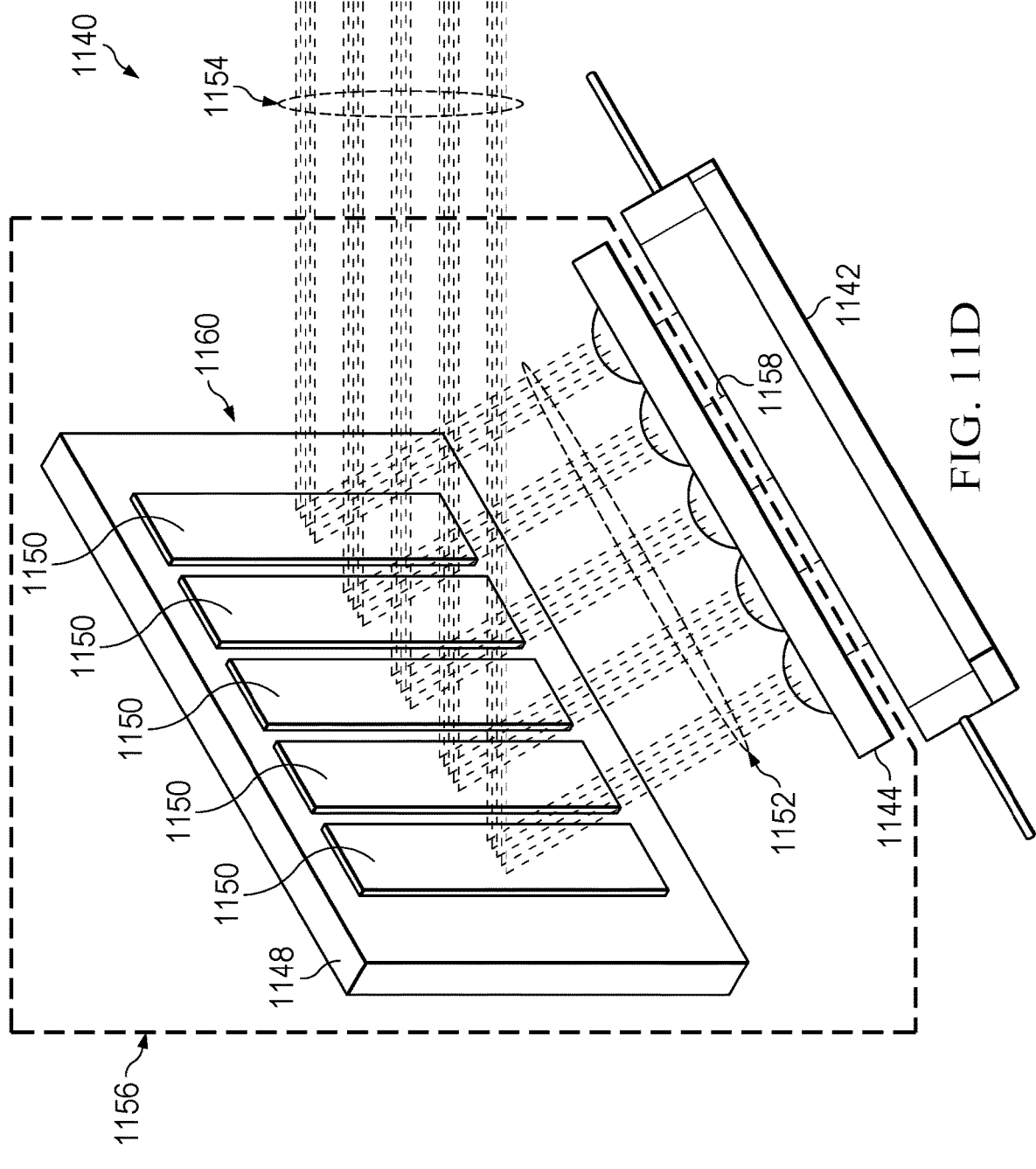
FIG. 11D illustrates another example laser light source.

FIG. 11A illustrates a laser light source 1100, FIG. 11B illustrates a laser beam footprint 1120 for the laser light source 1100, FIG. 11C illustrates a point spread function 1130 in the far field for the laser light source 1100, and FIG. 11D illustrates a laser light source 1140. The laser light source 1100 may be an example of the laser light source 102 illustrated in FIG. 1A, the laser light source 122 illustrated in FIG. 1B, the laser light source 172 illustrated in FIG. 1C, or the laser light source 214 illustrated in FIG. 2A. The laser light source 1100 contains a laser array 1102 and an optical element 1114 optically coupled to the laser array 1102. The laser array 1102 may be an example of the at least one laser 202 illustrated in FIG. 2A. In an example, the laser array 1102 has five rows and four columns of lasers, which may be multi-mode laser diodes. In other examples, the laser array 1102 may have a different number of rows and a different number of columns. For example, the laser array 1102 may have two, three, five, or six columns and may have two, three, four, or six columns. The laser array 1102 produces laser light 1116.

The optical element 1114 may be an example of the optical element 204 illustrated in FIG. 2A. The optical element 1114 includes a lens array 1104 and a louvered mirror 1108 optically coupled to the lens array 1104. The lens array 1104 is optically coupled to the laser array 1102, with lenses 1106 of the lens array 1104 corresponding to respective ones of the lasers of the laser array 1102. The lens array 1104 collimates the laser light 1116 along the fast-axis and partially collimates the laser light 1116 along the slow-axis to produce collimated light 1110. The louvered mirror 1108 is optically coupled to the lens array 1104. The louvered mirror 1106 has louvred mirror segments corresponding to the rows of lasers of the laser array 1102. In this example, there are five louvred mirror segments of louvered mirror 1108 and five rows of the laser array 1102. In other examples, there are a different number of louvred mirror segments, for example, two, three, four, or six louvred mirror segments. The louvred mirror 1108 reflects the collimated light 1110 to produce shaped light 1112. The phase of the shaped light 1112 may be modulated by an OPM, for example the OPM 206 illustrated in FIG. 2A, to produce a hologram in the far field.

FIG. 11B illustrates a laser beam footprint 1120 of the shaped light 1112. The laser beam footprint 1120 has an Etendue reduced in one axis by about 50% compared to the laser beam footprint 750 illustrated in FIG. 7B. The smaller Etendue allows for more beam expansion to illuminate the OPM which reduces the point spread function in the far field. FIG. 11C illustrates the point spread function 1130 in the far field of the shaped light 1112. The point spread function 1130 is smaller than the point spread function 760 illustrated in FIG. 7C.

FIG. 11D illustrates the laser light source 1140. The laser light source 1140 may be an example of the laser light source 102 illustrated in FIG. 1A, the laser light source 122 illustrated in FIG. 1B, the laser light source 172 illustrated in FIG. 1C, or the laser light source 214 illustrated in FIG. 2A. The laser light source 1140 includes a laser array 1142 and an optical element 1156 optically coupled to the laser array 1142. The laser array 1142 may be an example of the at least one laser 202 illustrated in FIG. 2A. In an example, the laser array 1142 has five rows and four columns of lasers, which may be multi-mode laser diodes. In other examples, the laser array 1142 may have a different number of rows and a different number of columns. For example, the laser array 1142 may have two, three, five, or six columns of lasers and may have two, three, four, or six rows of lasers. The laser array 1142 produces laser light 1158.

The optical element 1156 may be an example of the optical element 204 illustrated in FIG. 2A. The optical element 1156 contains a lens array 1144 and a mirror assembly 1160 containing a plate 1148 and mirror segments 1150 optically coupled to the lens array 1144. The plate 1148 may be a plate of glass. The lens array 1144 is optically coupled to the laser array 1142. The lens array 1144 produces light 1152 by partially collimating the laser light 1158. The plate 1148 is optically coupled to the lens array 1144. In an example, there is one mirror segment corresponding to each row of the laser array 1142. In the pictured example, there are five rows of lasers of the laser array 1142 and five mirror segments 1150 on the plate 1148. The use of the plate 1148 assists in alignment of the five mirror segments 1150 to the light 1152. In other examples there may be different numbers of mirror segments and rows of lasers, for example three, four, or six mirror segments. In an example, the plate 1148 and mirror segments 1150 are tilted about 45 degrees with respect to the laser array 1142. The mirror segments 1150 of the mirror assembly 1160 reflect the light 1152 to produce shaped light 1154. The phase of the shaped light 1154 may be modulated by an OPM, for example the OPM 206 illustrated in FIG. 2A, to produces a hologram in the far field. The point spread function of the shaped light 1154 in the far field is smaller than the point spread function 760 illustrated in FIG. 7C.

Figure 12:
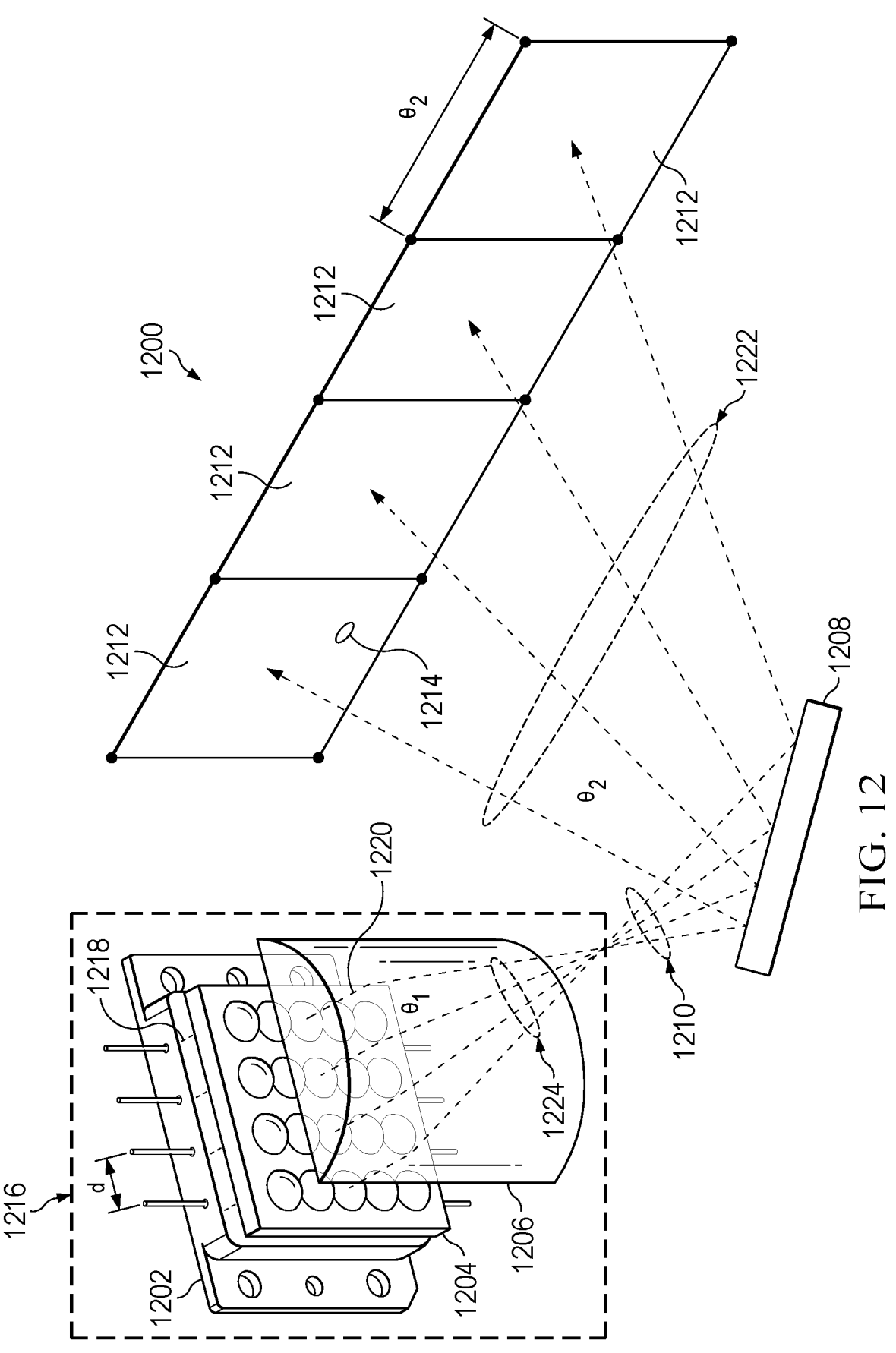
FIG. 12 illustrates an example optical projection system.

FIG. 12 illustrates an optical projection system 1200. The optical projection system 1200 may be an example of the optical projection system 100 illustrated in FIG. 1A, the optical projection system 120 illustrated in FIG. 1B, the optical projection system 170 illustrated in FIG. 1C, or the optical projection system 200 illustrated in FIG. 2A. The optical projections system 1200 includes a laser light source 1216 and an OPM 1208 optically coupled to the laser light source 1216. The OPM 1208 may be an example of the OPM 104 illustrated in FIG. 1A, the OPM 124 illustrated in FIG. 1B, the OPM 174 illustrated in FIG. 1C, or the OPM 206 illustrated in FIG. 2A. The OPM 1208 may be a PLM, a phase-only LCoS device, or a deformable mirror device. The laser light source 1216 may be an example of the laser light source 102 illustrated in FIG. 1A, the laser light source 122 illustrated in FIG. 1B, the laser light source 172 illustrated in FIG. 1C, or the laser light source 214 illustrated in FIG. 2A.

The laser light source 1216 contains a laser array 1202, a lens array 1204 optically coupled to the laser array 1202, and a cylindrical lens 1206 optically coupled to the lens array 1204. The laser array 1202 may be an example of the at least one laser 202 illustrated in FIG. 2A. In an example, the laser array 1202 is an array of multi-mode laser diodes. In an example, the laser array 1202 has five rows and four columns of lasers, which may be multi-mode laser diodes. In other examples, the laser array 1202 may have a different number of rows of lasers and a different number of columns of lasers. For example, the laser array 1202 may have two, three, five, or six columns of lasers and may have two, three, four, or six rows of lasers. The laser array 1202 produces laser light 1218. The laser array 1202 may produce light from all columns of lasers, or may produce light in a subset of the columns of lasers. For example, the laser array 1202 may time sequentially illuminate the columns of lasers, for example illuminating the first row of lasers, then illuminating the second row of lasers, then illuminating the third row of lasers, then illuminating the fourth row of lasers, then illuminating the first row of lasers. In an additional example, M rows of laser are illuminated at a time, and there are N/M subframe, where N is the total number of rows of lasers.

The lens array 1204 and cylindrical lens 1206 may be an example of the optical element 204 illustrated in FIG. 2A. The lens array 1204 is optically coupled to the laser array 1202, with the lenses of the lens array 1204 corresponding to respective lasers of the laser array 1202. The lens array 1204 produces the collimated light 1220 by partially collimating the laser light 1218. The cylindrical lens 1206 is optically coupled to the lens array 1204. The cylindrical lens 1206 is curved in one axis which directs light from the columns of lasers of the laser array 1202 towards the OPM 1208 at respective angles to produce separate field of view angles in the subframes 1212. In additional examples (not pictured), a spherical lens is used instead of the cylindrical lens 1206, to create an M×N grid of subframes or fields of view corresponding to an M×N grid of lasers. In one examples, the M×N beams of light from M×N lasers illuminates the OPM 1208 in a single zone at different angles, to produce M×N sub-frames. In another example, the M×N beams of light from M×N lasers illuminates the OPM 1208 in M×N zones, to produce M×N sub-frames. A spherical lens produces a subframe corresponding to each laser. The cylindrical lens 1206 produces shaped light 1224 based on the collimated light 1220. The shaped light 1224 contains a beam for each column of laser diodes, with an illumination angle of $\theta_1$ between the beams. The columns of lasers of the laser array 1202 have a separation of d. The focal length of the cylindrical lens, f, is given by:

$$f = \frac{d}{\tan(\theta_1)}.$$

The OPM 1208 is optically coupled to the cylindrical lens 1206. The phase of the shaped light 1210 is modulated by the OPM to produce modulated light 1222. The modulated light 1222 forms four subframes 1212, with a subframe corresponding to each column of laser diodes of the laser array 1202. The light from each column of lasers encounters pixel elements in a segment of the OPM 1208. In an example, the OPM 1208 has one zone for each column of laser diodes. In the illustrated example, there are four columns of laser diodes and four subframes, but there may be a different number, for example, two, three, five, or six. In the illustrated example, the OPM 1208 has four zones, with each zone corresponding to a column of lasers. In another example (not pictured), the OPM 1208 is located where the four beams combine, and all of the light illuminates the OPM 1208 in a single zone. In this example, the light from the four different beams of light has different angles, to produce the four subframes 1212. In an example, the OPM 1208 produces a separate hologram in the far field time sequentially for each subframe. The laser array 1202 produces light in a first column, and the OPM 1208, using a first zone, produces a first hologram in a first subframe. Then, the laser array 1202 produces light in a second column, and the OPM 1208, using a second zone, produces a second hologram in a second subframe. Then, the laser array 1202 produces light in a third column, and the OPM 1208, using a third zone, produces a third hologram in a third subframe. Then, the laser array 1202 produces light in a fourth column, and the OPM 1208, using a fourth zone, produces a fourth hologram in a fourth subframe. Then, the laser array produces light in the first column, and the OPM, using the first zone, produces a fifth hologram in the first subframe. In the pictured example, there are four subframes, but there may be fewer subframes, for example two or three, or there may be more subframes, for example five or six. The OPM 1208 produces the modulated light 1222 with an OPM field of view of $\theta_2$ between the subframes. The value of the diffraction angle $\theta_2$ is equal to:

$$\theta_2 = \left(\frac{\lambda}{p}\right),$$

where $\lambda$ is the wavelength of light and p is the OPM pixel pitch. In the illustrated example, in which the subframes 1212 do not overlap, the angle of illumination $\theta_1$ is equal to the diffraction $\theta_2$. However, in other examples in which the subframes 1212 overlap, the angle of illumination $\theta_1$ is smaller to the diffraction $\theta_2$. When the subframes 1212 overlap, the peak brightness is increased in the overlapping region when time multiplexing is used. In additional examples, the angle of illumination $\theta_1$ is greater than to the diffraction $\theta_2$.

The modulated light 1210 has a point spread function 1214 in the far field. Because the field of view is four times the field of view without the cylindrical lens 1206, the point spread function 1214 is smaller with respect to the display area compared to the point spread function 760 illustrated in FIG. 7C.

Figure 13:
FIG. 13 illustrates an example optical projection system.

FIG. 13 illustrates an optical projection system 1300. The optical projection system 1300 contains a laser light source 1322 and an OPM 1308 optically coupled to the laser light source 1322. The laser light source 1322 may be an example of the laser light source 102 illustrated in FIG. 1A, the laser light source 122 illustrated in FIG. 1B, the laser light source 172 illustrated in FIG. 1C, or the laser light source 214 illustrated in FIG. 2A. The laser light source 1322 contains at least one laser 1318 and an optical combining element 1306 optically coupled to the at least one laser 1318. The at least one laser 1318 may be an example of the at least one laser 202 illustrated in FIG. 2A. The at least one laser 1318 contains a laser assembly 1302 which produces a first portion of laser light 1310 and a laser assembly 1304 which produces a second portion of laser light 1312. In some examples, the laser assembly 1302 is the different from the laser assembly 1304. For example, the laser assembly 1302 may be a single laser diode and the laser assembly 1304 may be a laser array, which may be an array of multi-mode laser diodes. In another example, the laser assembly 1302 produces the first portion of laser light 1310 having a first polarization and the laser assembly 1304 produces a second portion of laser light 1312 having a second polarization different from the first polarization. In an additional example, the laser assembly 1302 produces the first portion of laser light 1310 having a first wavelength and the laser assembly 1304 produces the second portion of laser light 1312 having a second wavelength different from the first wavelength. In an additional example, the laser assembly 1304 has a lens assembly that is rotated ninety degrees with respect to a lens in the laser assembly 1302. In another example, a half waveplate is after the collimator in the laser assembly 1304, which rotates the polarization of the laser light 1312 90 degrees with respect to the polarization of the laser light 1310 from the laser assembly 1302 In an example, the laser assembly 1302 and the laser assembly 1304 are time sequentially illuminated, and the OPM 1308 produces separate holograms in the far field for light illuminated by the laser assembly 1302 and light illuminated by the laser assembly 1304. In another example, the laser assembly 1302 and the laser assembly 1304 are simultaneously illuminated, and the OPM 1308 produces a single hologram in the far field with light from the laser assembly 1302 and from the laser assembly 1304.

The optical combining element 1306 is optically coupled to the laser assembly 1302 and to the laser assembly 1302. The optical combining element 1306 combines the first portion of the laser light 1310 with a second portion of the laser light 1312 to produce combined light 1314. The optical combining element 1306 transmits the first portion of the laser light 1310 having a first characteristic and reflects the second portion of laser light 1312 having a second characteristic different than the first characteristic to produce the combined light 1314. In one example, the optical combining element 1306 is a PBS, the first characteristic is a first polarization, and the second characteristic is a second polarization different than the first polarization. The PBS may be a plate, a cube, or a wire-grid polarizer. In another example, the optical combining element 1306 is a dichroic mirror, the first characteristic is a first wavelength, and the second characteristic is a second wavelength different than the first wavelength.

The OPM 1308 is optically coupled to the optical combining element 1306. The OPM 1308 modulates the phase of the combined light 1314 to produce modulated light 1316 to form a hologram in the far field. In some example, additional optical elements, not pictured, are disposed between the optical combining element 1306 and the OPM 1308. By using combined light from the laser assembly 1302 and from the laser assembly 1304, the optical projection system 1300 achieves a smaller point spread function in the far field compared to the point spread function 760 illustrated in FIG. 7C.

Figure 14A:
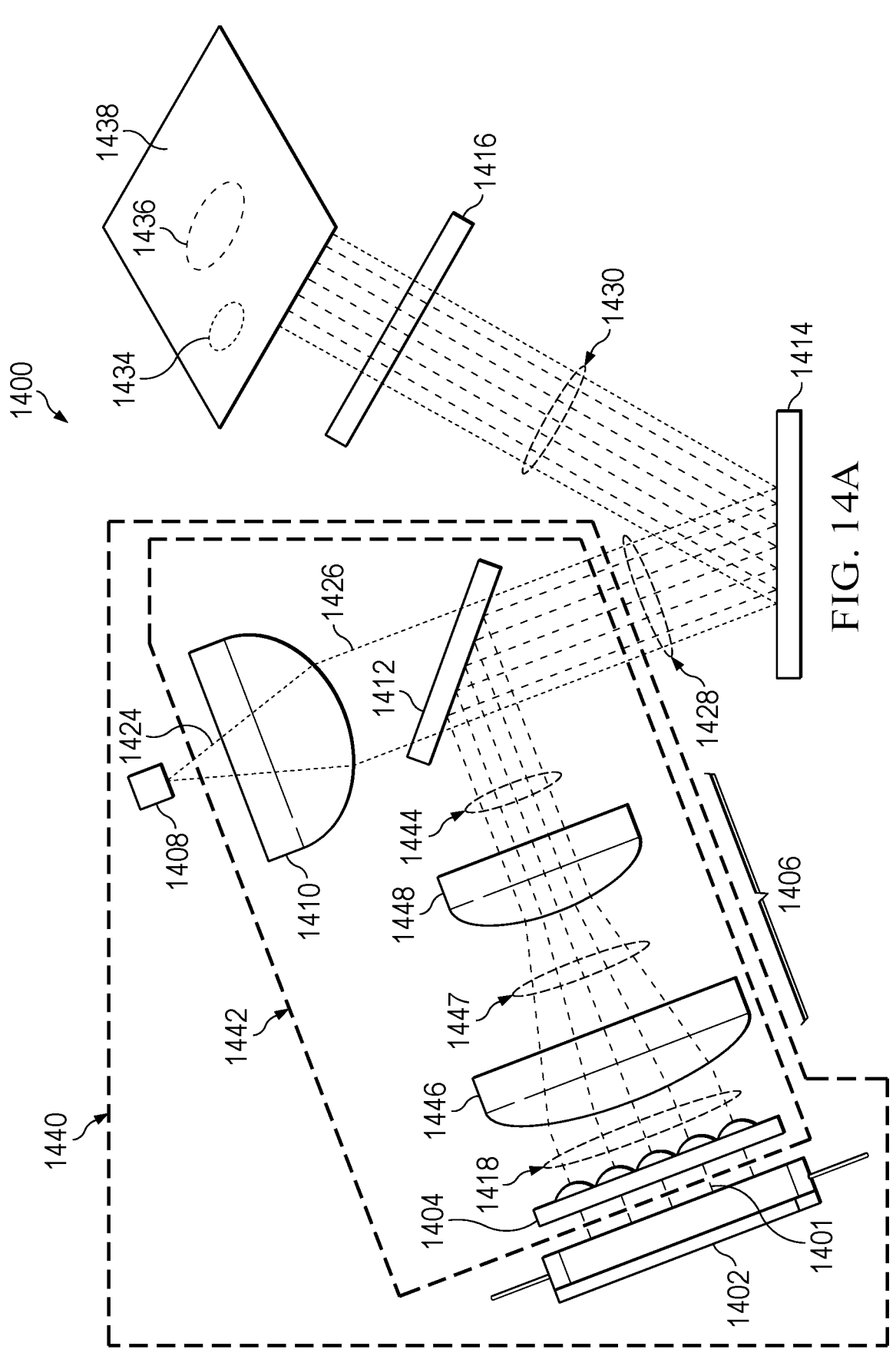
FIG. 14A illustrates an example optical projection system.
Figure 14B:
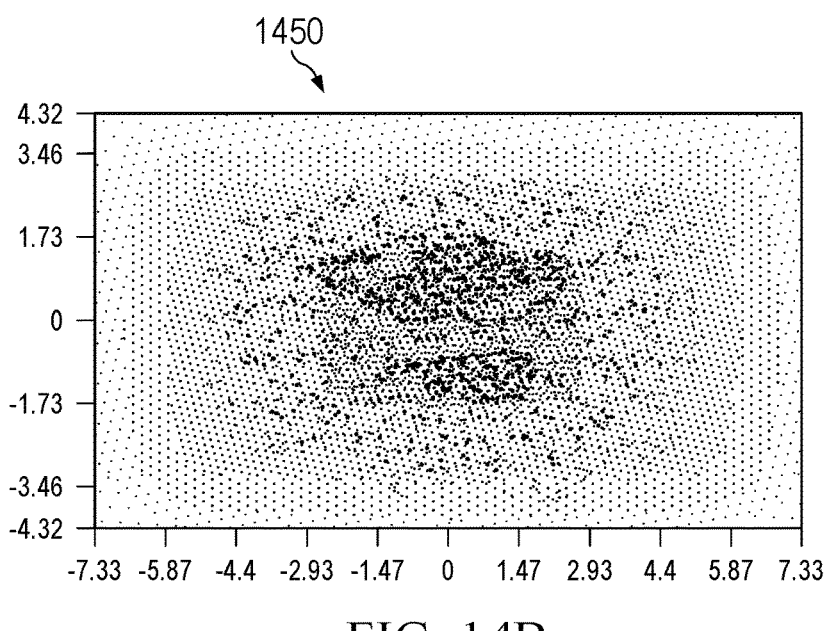
FIG. 14B illustrates a laser beam footprint illuminated by a single laser diode.
Figure 14C:
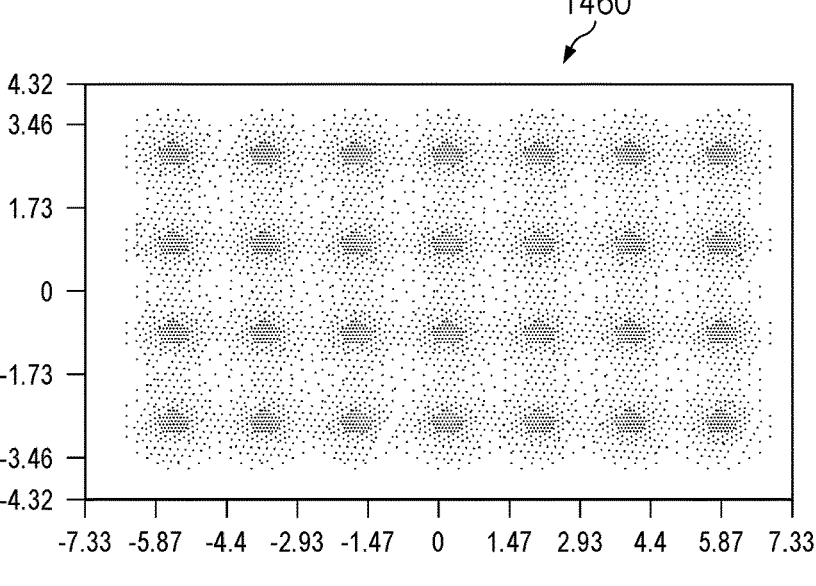
FIG. 14C illustrates a laser beam footprint illuminated by a laser array.

FIG. 14A illustrates an optical projection system 1400, FIG. 14B illustrates a laser beam footprint 1450 illuminated by a single diode of the optical projection system 1400, FIG. 14C illustrates a laser beam footprint 1460 illuminated by a laser array of the optical projection system 1400, and FIG.

14D illustrates a cross section of a point spread function in the far field with illumination by both a laser array and by a single laser diode of the optical projection system 1400. The optical projection system 1400 contains a laser light source 1440, an OPM 1414 optically coupled to the laser light source 1440, and an image plane 1416. The laser light source 1440 may be an example of the laser light source 102 illustrated in FIG. 1A, the laser light source 122 illustrated in FIG. 1B, the laser light source 172 illustrated in FIG. 1C, or the laser light source 214 illustrated in FIG. 2A. The laser light source 1440 contains a laser diode 1408, a laser array 1402, and an optical element 1442 optically coupled to the laser diode 1408 and to the laser array 1402. The laser diode 1408 and the laser array 1402 may be contained in the at least one laser 202 illustrated in FIG. 2A. In an example, the laser diode 1408 is an example of the laser assembly 1304 illustrated in FIG. 13 and the laser array 1402 is an example of the laser assembly 1304 illustrated in FIG. 13. The laser diode 1408 is a single laser diode, which may be a multi-mode laser diode, that produces a first portion of laser light 1424 having a first characteristic. The laser array 1402 is an array of laser diodes, which may be multi-mode laser diodes with four columns and five rows of lasers, that produces a second portion of laser light 1401 having a second characteristic different than the first characteristic. In other examples, the laser array 1440 has a different number of columns, for example, two, three, five, or six columns, and a different number of rows, for example two, three, four, or six rows. In one example, the first characteristic is a first polarization and the second characteristic is a second polarization. In another example, the first characteristic is a first wavelength and the second characteristic is a second wavelength.

The optical element 1442 may be an example of the optical element 204 illustrated in FIG. 2A. The optical element 1442 contains a collimator 1410, a lens array 1404, beam shaping optics 1406 optically coupled to the lens array 1404, and an optical combining element 1412 optically coupled to the collimator 1410 and to the beam shaping optics 1406. The collimator 1410 is optically coupled to the laser diode 1408. The collimator 1410 collimates the first portion of laser light 1424 to produce collimated light 1426. A lens array 1404 is optically coupled to the laser array 1402, with lenses of the lens array 1404 corresponding to respective lasers of the laser array 1402. The lens array 1404 collimates the second portion of the laser light 1401 along the fast-axis and partially collimates the laser light 1401 along the slow-axis to produce partially collimated light 1418. Beam shaping optics 1406 is optically coupled to the lens array 1404. The beam shaping optics 1406 produces light 1444 based on the partially collimated light 1418. The beam shaping optics 1406 contains a lens 1446 and a lens 1448. In one example, the lens 1446 is a positive-powered lens and the lens 1448 is a negative powered lens. In another example, the lens 1446 and the lens 1448 are both positive-powered lenses. The lens 1446 focuses the partially collimated light 1418 to produce light 1447, and the lens 1448 focuses the light 1447 to produce the light 1444. An optical combining element 1412 is optically coupled to the collimator 1410 and to the beam shaping optics 1406. The optical combining element 1412 may be an example of the optical combining element 1306 illustrated in FIG. 13. The optical combining element 1412 combines the collimated light 1426 and the light 1444 by transmitting the collimated light 1426 having the first characteristic and reflecting the light 1444 having the second characteristic to produce shaped light 1428. In one example, the optical combining element 1412 is a PBS, for example a plate, a cube, or a wire-grid polarizer, the first characteristic is a first polarization, and the second characteristic is a second polarization different from the first polarization. In another example, the optical combining element 1412 is a dichroic mirror, the first characteristic is a first wavelength, and the second characteristic is a second wavelength different from the first wavelength.

The OPM 1414 is optically coupled to the optical combining element 1412. They OPM may be a PLM, a phase based LCOS device, or a deformable mirror device. The OPM 1414 modulates the phase of the shaped light 1428 to produce modulated light 1430, which forms a hologram in the image plane 1416. The far field 1438 illustrates a point spread function 1436 from light produced by the laser array 1402 and a point spread function 1434 from light produced by the laser diode 1408. The point spread function 1434 is significantly smaller than the point spread function 1436. The laser diode 1434 has a lower power than the laser array 1402, because the laser diode 1434 has a much smaller Etendue than the laser array 1402, which has a large diameter. The laser diode 1408 allows more beam expansion prior to illuminating the PLM, which reduces the point spread function in the far field. FIG. 14B illustrates the laser beam footprint 1450 produced by light from the laser diode 1408 at the OPM 1414. FIG. 14C illustrated the laser beam footprint 1460 produced by light from the laser array 1402 at the OPM 1414.

In one example, the laser diode 1408 and the laser array 1402 are illuminated time sequentially, and the OPM 1414 forms separate holograms for light from the laser diode 1408 and light from the laser array 1402. The light from the laser array 1402 is used for a high luminescence and a larger point spread function, and the light from the laser diode 1408 is used for a lower luminescence and a smaller point spread function.

Figure 14D:
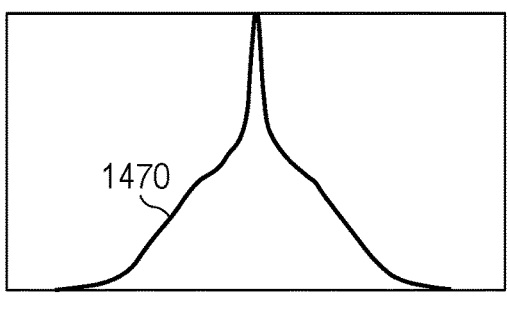
FIG. 14D illustrates a cross section of a point spread function in the far field with illumination by both a laser array and by a single laser diode.

In another example, the laser diode 1408 and the laser array 1402 are illuminated concurrently, and the OPM 1414 produces a single hologram with light from the laser diode 1408 and light from the laser array 1402. Using the laser diode 1408 and the laser array 1402 simultaneously can produce the point spread function having a cross section 1470 in the far field 1438 illustrated in FIG. 14D. The point spread function 1470 has a high peak intensity center but gradual roll off. Concurrently illuminating the laser diode 1408 and the laser array 1440 has a high luminescence and a small point spread function in the far field.

Figure 15A:
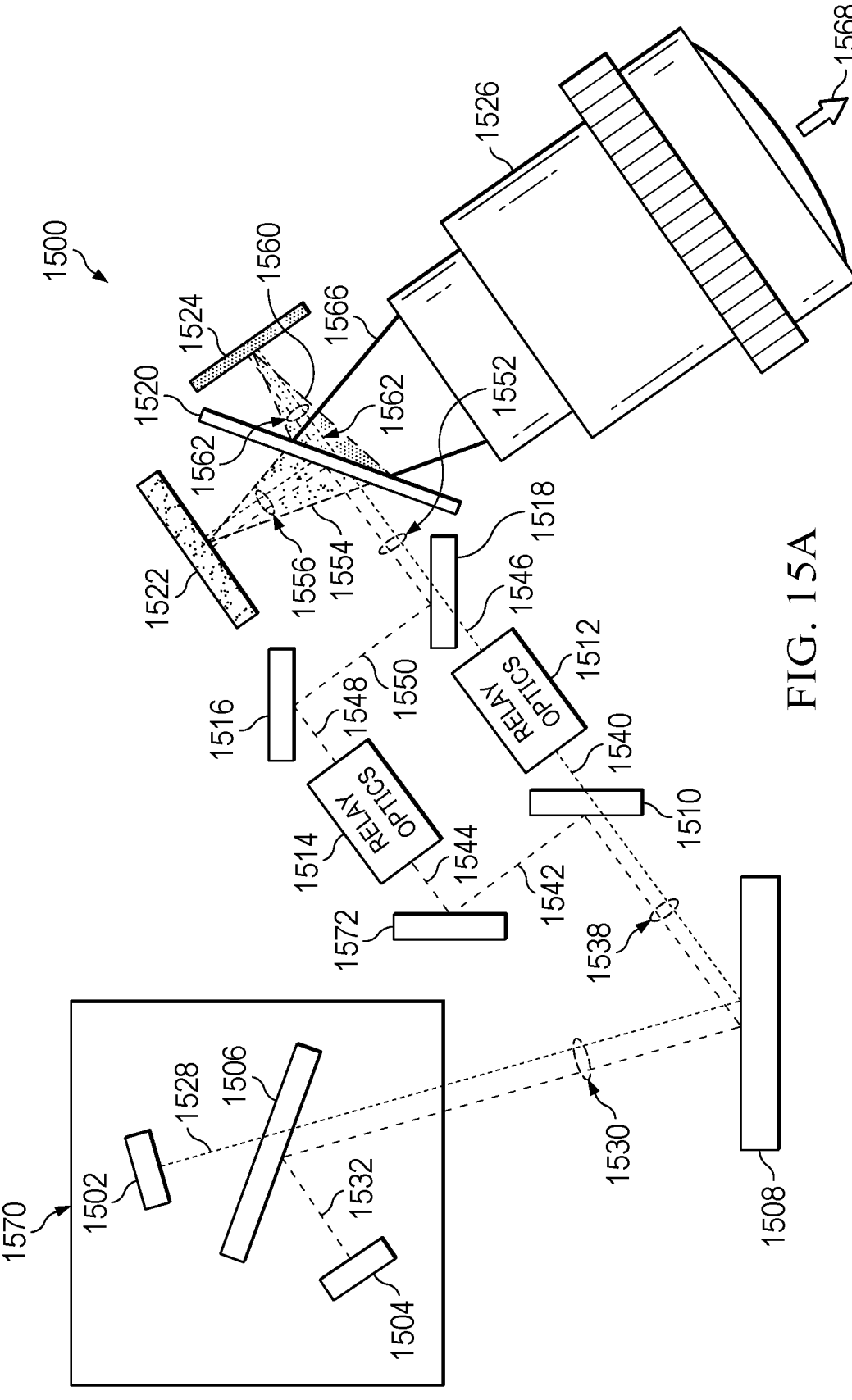
FIG. 15A illustrates an example optical projection system and FIG. 15B illustrates fields of view for an example optical projection system.
Figures 15B, 16A:
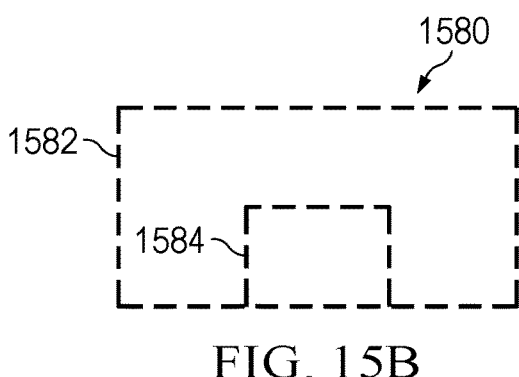
FIG. 16A illustrates an example optical projection system.

FIG. 15A illustrates an optical projection system 1500 and FIG. 15B illustrates fields of view 1580 for the optical projection system 1500. The optical projection system 1500 includes a laser light source 1570. The laser light source 1570 may be an example of the laser light source 102 illustrated in FIG. 1A, the laser light source 122 illustrated in FIG. 1B, the laser light source 172 illustrated in FIG. 1C, or the laser light source 214 illustrated in FIG. 2A. The laser light source 1570 includes at least one laser 1502, at least one laser 1504, and a PBS 1506 optically coupled to the at least one laser 1502 and to the at least one laser 1504. The at least one laser 1502 and the at least one laser 1504 may be examples of the at least one laser 202 illustrated in FIG. 2A. In an example, the at least one laser 1502 is an example of the laser assembly 1302 illustrated in FIG. 13 and the at least one laser 1504 is an example of the laser assembly 1304 illustrated in FIG. 13. In one example, both the at least one laser 1502 and the at least one laser 1504 are laser arrays, which may be arrays of multi-mode laser diodes. In another example, the at least one laser 1502 is a laser array and the at least one laser 1504 is a single laser diode. In another example, the at least one laser 1502 is a single laser diode and the at least one laser 1504 is a laser array. The at least one laser 1502 produces a first portion of laser light 1528 having a first polarization and the at least one laser 1504 produces a second portion of laser light 1532 having a second polarization different than the first polarization. In an example, the first polarization is P polarized and the second characteristic is S polarized. In another example, the first polarization is S polarized and the second polarization is P polarized. The PBS 1506 may be an example of the optical element 204 illustrated in FIG. 2A. The PBS 1506 may be an example of the optical combining element 1306 illustrated in FIG. 13. The PBS 1506 may be a plate, a cube, or a wire-grid polarizer. The PBS 1506 combines the first portion of laser light 1528 and the second portion of laser light 1532 to produce shaped light 1530 having the first polarization and the second polarization. The PBS 1506 transmits the first portion of laser light 1528 having the first polarization and reflects the second portion of laser light 1532 to produce the shaped light 1530. In an example, the at least one laser 1502 and the at least one laser 1504 are time sequentially turned on to time sequentially illuminate the OPM 1508.

The OPM 1508 is optically coupled to the PBS 1506. The OPM 1508 may be an example of the OPM 174 illustrated in FIG. 1C or the OPM 1308 illustrated in FIG. 13. The OPM 1508 may be a PLM, a phase-only LCOS device, or a deformable mirror device. The OPM 1508 modulates the phase of the shaped light 1530 to produce modulated light 1538 to produce a hologram in the far field. The OPM 1508 time sequentially produces separate holograms in the far field for light from the at least one laser 1502 and for light from the at least one laser 1504.

A PBS 1510 is optically coupled to the OPM 1508. The PBS 1510 may be a plate, a cube, or a wire-grid polarizer. The PBS 1510 separates the modulated light 1538 based on polarization to separate light from the at least one laser 1502 from the light from the at least one laser 1504 to produce second path light 1540 and first path light 1542, respectively. In one example, the second path light 1540 has the first polarization and the first path light 1542 has the second polarization. In another example, the second path light 1540 has the second polarization and the first path light 1542 has the first polarization. The second path light 1540 is shaped by relay optics 1512 to produce second path processed light 1546. The relay optics 1512 takes the diffracted light from the OPM 1508 and focuses it to form an image in the plane of the reflective phosphor 1522 and in the plane of the reflective diffuser 1524. The second path light 1540 has a smaller Etendue, for example if produced by a single laser diode, to illuminate a smaller area. The mirror 1572 is optically coupled to the PBS 1510. The first path light 1542 is reflected by mirror 1572 to produce first reflected light 1544. The relay optics 1514 shapes the first reflected light 1544 to produce first path processed light 1548. The relay optics 1514 takes the diffracted light from the OPM 1508 and focuses it to form an image in the plane of the reflective phosphor 1522 and in the plane of the reflective diffuser 1524. The relay optics 1512 may contain a single lens or a series of lenses. The mirror 1516 reflects the first path processed light 1548 to produce first path processed light 1550. In one example, the first reflected light 1544 has a high brightness, and originates from a high power multi-mode laser array. In an example, the focal length of relay optics 1514 is shorter than the focal length of the relay optics 1512. The shorter focal length of the relay optics 1514 results in the field of view 1582 illustrated in FIG. 15B, and the longer focal length of the relay optics 1512 results in the field of view 1584 illustrated in FIG. 15B. The light from the first path and the second path is combined by a PBS 1518. The PBS 1518 may be a plate, a cube, or a wire-grid polarizer. The PBS 1518 is optically coupled to relay optics 1512 and to the relay optics 1514 by way of the mirror 1516. The PBS 1518 transmits the second path processed light 1546, which has a particular polarization and reflects the first path processed light 1550, which has a different polarization, to produce combined light 1552.

The dichroic mirror 1520 transmits a portion of the combined light 1552 as light 1562 and reflects a portion of the combined light 1552 as light 1556. In an example, the dichroic mirror 1520 transmits 4-6 percent of the combined light 1552 and reflects 94-96% of the combined light 1552. The light 1556 illuminates a reflective phosphor 1522, which produces light 1554 and directs the light 1554 towards the dichroic mirror 1520. Light 1554 is a different color than light 1556. In an example, the reflective phosphor 1522 is a yellow phosphor which is configured to produce yellow light, containing red light and green light, responsive to receiving blue light. The dichroic mirror 1520 transmits the light 1554 as a portion of light 1566. The light 1562 illuminates a reflective diffuser 1524. The reflective diffuser 1524 reflects and diffuses the light 1562 as light 1560, to improve the uniformity of the light. The dichroic mirror 1520 transmits a portion of the light 1560 and reflects a portion of the light 1560 as a portion of the light 1566. The projection optics 1526 projects the light 1566 to produce projection 1568. The projection 1568 is projected on the road. The projection 1568 may project symbols on the road, and/or may implement a smart headlight.

FIG. 15B illustrates a headlight field of view 1580 for the field of view of light projected on a road by the optical projection system 1500. The headlight field of view 1580 contains the field of view 1582 and the field of view 1584. The field of view 1582 arises from light that follows the first path. The field of view 1582, in an example, is 30 degrees wide and 15 degrees high. In other examples, the field of view 1582 has other dimensions. The field of view 1582 has a wider field of view and a larger point spread function in the far field. The field of view 1582 is used for adaptive driving beam. Adaptive beam driving needs a high luminescence and does not need a small point spread function. The field of view 1584 is smaller than the field of view 1582. The field of view 1584 contains light that followed the second path. The field of view 1584 has a smaller field of view and a smaller point spread function. In an example, the field of view 1584 is 14 degrees wide and 7 degrees high. In other examples, the field of view 1584 has different dimensions. The field of view 1584 is used for both adaptive driving beam and for symbol projection. The smaller point spread function of the field of view 1584 is useful to obtain an appropriate resolution for symbol projection.

Figure 16B:
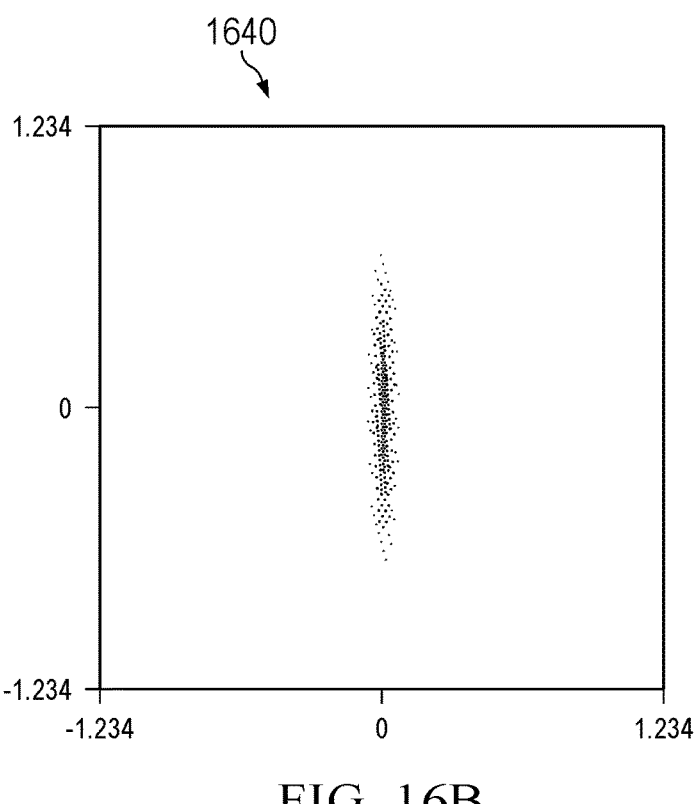
FIG. 16B illustrates a point spread function in the far field for a first laser path.
Figure 16C:
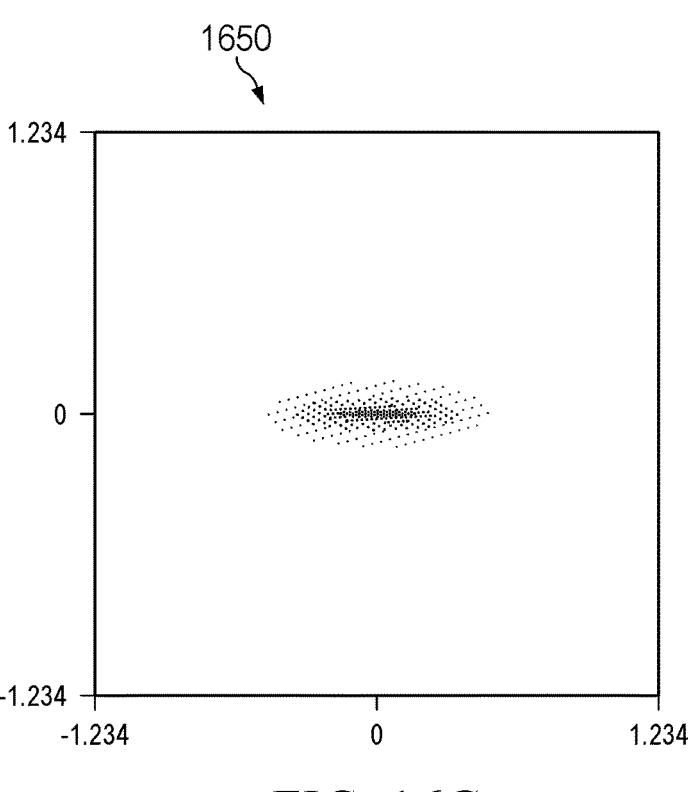
FIG. 16C illustrates a point spread function in the far field for a second laser path.
Figure 16D:
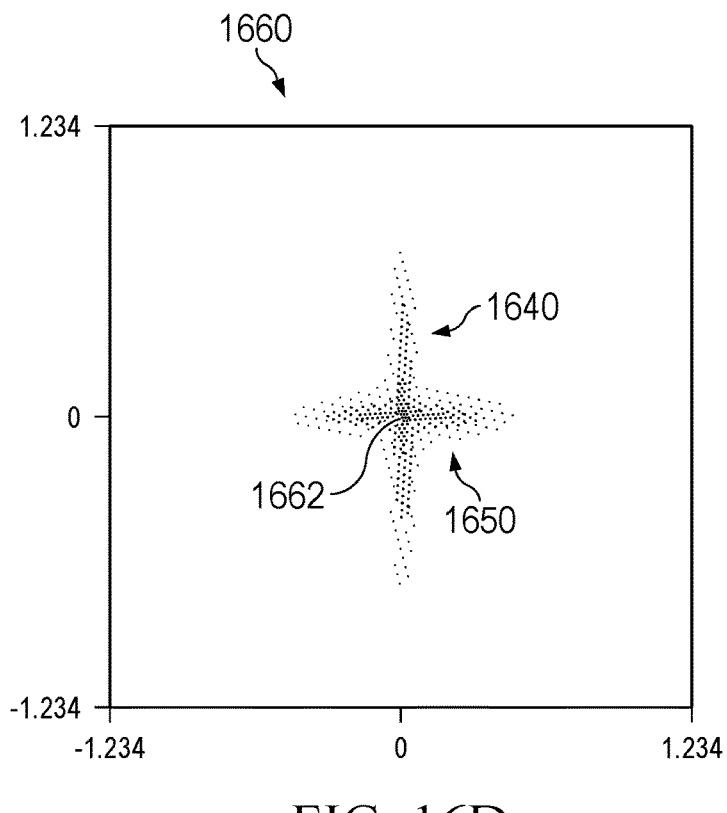
FIG. 16D illustrates a point spread function in the far field for both laser paths.
Figure 16E:
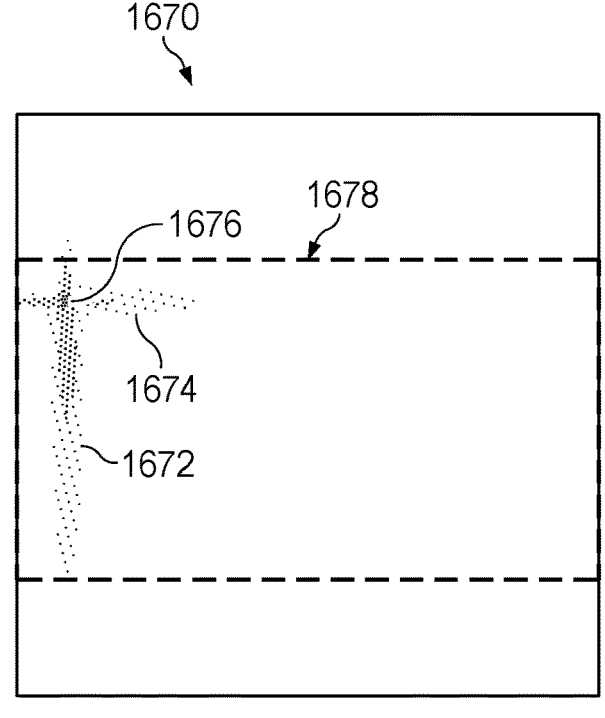
FIG. 16E illustrates a point spread function in the far field for a horizontally steered first laser path and a vertically steered second laser path.

FIG. 16A illustrates an optical projection system 1638, FIG. 16B illustrates a point spread function 1640 in the far field for a first laser path of the optical projection system 1638, FIG. 16C illustrates a point spread function 1650 in the far field for a second laser path of the optical projection system 1638, FIG. 16D illustrates a point spread function 1660 in the far field for two laser paths of the optical projection system 1638, and FIG. 16E illustrates a point spread function 1670 in the far field for a horizontally steered first laser path and a vertically steered second laser path of the optical projection system 1638. The optical projection system 1638 contains a laser light source 1600, an OPM 1634 optically coupled to the laser light source 1600, and an SLM 1601 optically coupled to the OPM 1634. The laser light source 1600 contains a laser array 1602, a laser array 1608, and an optical element 1630 optically coupled to the laser array 1602 and to the laser array 1608. The laser light source 1600 may be an example of the laser light source 102 illustrated in FIG. 1A, the laser light source 122 illustrated in FIG. 1B, the laser light source 172 illustrated in FIG. 1C, or the laser light source 214 illustrated in FIG. 2A. The laser array 1602 and the laser array 1608 may be an example of the at least one laser 202 illustrated in FIG. 2A. The optical element 1630 may be an example of the optical element 204 illustrated in FIG. 2A. The optical element 1630 contains an FAC lens 1604, a SAC lens 1606 optically coupled to the FAC lens 1604, an FAC lens 1610, a SAC lens 1612 optically coupled to the FAC lens 1610, and a PBS 1614 optically coupled to the SAC lens 1606 and to the SAC lens 1612. The PBS 1614 may be an example of the optical combining element 1306, illustrated in FIG. 13. The PBS 1614 may be a plate, a cube, or a wire-grid polarizer. The laser light source 1600 contains a laser assembly 1605, which may be an example of the laser assembly 1302 illustrated in FIG. 13, and the laser assembly 1632, which may be an example of the laser assembly 1304 illustrated in FIG. 13. The laser assembly 1605 contains the laser array 1602, the FAC lens 1604 optically coupled to the laser array 1602, and the SAC lens 1606 optically coupled to the FAC lens 1604. The laser assembly 1632 contains the laser array 1608, the FAC lens 1610 optically couple to the laser array 1608, and the SAC lens 1612 optically coupled to the FAC lens 1610.

The laser array 1602 and the laser array 1608 are arrays of laser diodes, which may be multi-mode laser diodes. In an example, the laser array 1602 has four rows and five columns, and the laser array 1606 has four columns and five rows. The laser array 1608 may have a number of rows equal to the number of columns of the laser array 1602, and the laser array 1608 may have a number of columns equal to the number of rows of the laser array 1602, but there may be different numbers of rows and columns. The laser array 1602 produces a first portion of laser light 1616 and the laser array 1608 produces a second portion of laser light 1622. In an example, the laser array 1602 and the laser array 1608 time sequentially produce light. In an example, the first portion of laser light 1616 and the second portion of laser light 1622 are red light. In other examples, the first portion of laser light 1616 and the second portion of laser light 1622 are another color, for example blue light or green light. In an example, the first portion of laser light 1616 has a first polarization and the second portion of laser light 1622 has a second polarization different than the first polarization. In an example, the first polarization is S polarized and the second polarization is P polarized. In another example, the first polarization is P polarized and the second polarization is S polarized.

The FAC lens 1604 is optically coupled to the laser array 1602. The FAC lens 1604 collimates the first portion of laser light 1616 along the fast-axis to produce light 1618. The SAC lens 1606 is optically coupled to the FAC lens 1604. The SAC lens 1606 collimates the light 1618 in the slow-axis to produce collimated light 1620, which is collimated both along the fast-axis and the slow-axis. In another example, (not pictured) the SAC lens 1606 is closer to the laser array 1602 than the FAC lens 1604. The FAC lens 1610 is optically coupled to the laser array 1608. The FAC lens 1610 produces light 1624 by collimating the laser light 1622 along the fast-axis. The SAC lens 1612 is optically coupled to the FAC lens 1610. The SAC lens 1612 collimates the light 1624 along the slow-axis to produce collimated light 1626, which is collimated along the slow-axis and the fast-axis. In another example (not pictured), the SAC lens 1612 is closer to the laser array 1608 than the FAC lens 1610. The PBS 1614 is optically coupled to the SAC lens 1606 and to the SAC lens 1612. The PBS 1614 combines the collimated light 1620 with the collimated light 1626 to produce shaped light 1628. The PBS 1614 transmits the collimated light 1620 having the first polarization and reflects the collimated light 1626 having the second polarization.

The OPM 1634 is optically coupled to the PBS 1614. The OPM 1634 modulates the phase of the shaped light 1628 to produce modulated light 1636. The OPM 1634 produces separate time sequential holograms to modulate light originating from the laser array 1602 and light originating from the laser array 1608. The OPM 1634 sequentially produces the respective holograms when the OPM 1634 is illuminated by the respective laser array. The OPM 1634 may be a PLM, a phase-only LCOS device, or a deformable mirror device.

The SLM 1601 is optically coupled to the OPM 1634. The modulated light 1636 produces a hologram which illuminates the SLM for a high dynamic range. The SLM produces an image 1603 based on the modulated light 1636. The SLM may be a DMD, a transmissive liquid crystal display device, or an LCOS device.

FIGS. 16B-E illustrate point spread functions in the far field for the optical projection system 1638. The point spread function 1640 in the far field illustrated in FIG. 16B shows the point spread function generated light from the laser array 1602, which has a vertical spread. The point spread function 1650 in the far field illustrated in FIG. 16C shows the point spread function generated from light from the laser array 1608, which has a horizontal spread. FIG. 16D shows the point spread function 1660 in the far field, which is the point spread function 1640 and the point spread function 1650 combined in a cross-like pattern with a high intensity peak at a spot 1662. The point spread function 1660 and the point spread function 1650 will appear combined if they are displayed in quick succession. The point spread function 1660 appears smaller, because it has a high peak where point spread function 1640 and point spread function 1650 intersect at spot 1662. FIG. 16E shows a point spread function 1670 where the point spread functions in the far field from the laser array 1602 and from the laser array 1608 are steered. The point spread function 1640 can be steered horizontally or vertically based on the hologram produced by the OPM 1634, to produce a point spread function 1672 in the far field. The point spread function 1650 can be steered vertically or horizontally based on the hologram produced by the OPM 1634 to produce a point spread function 1674 in the far field. The point spread function 1672 and the point spread function 1674 intersect at a spot 1676, which represents a bright spot having a small point spread function. The region 1678 show a 16:9 region, which may be the dimensions of the SLM 1601. The OPM may steer the point spread functions within the region 1678 based on the holograms used. In some examples (not pictured), an aperture may be used, which reduces the wings of the point spread function spot size to further improve resolution at the expense of efficiency.

Figure 17A:
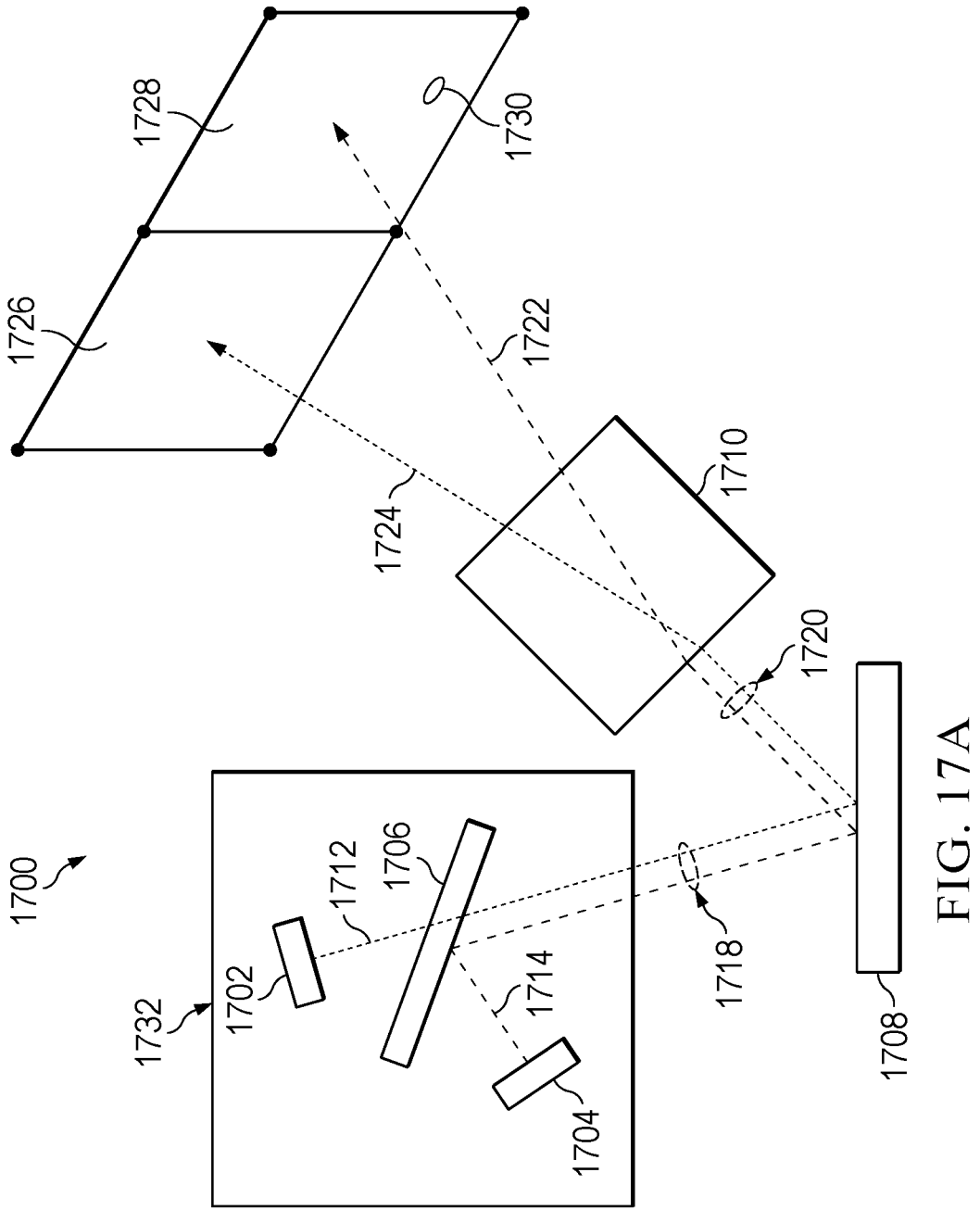
FIG. 17A illustrates another example optical projection system.
Figure 17B:
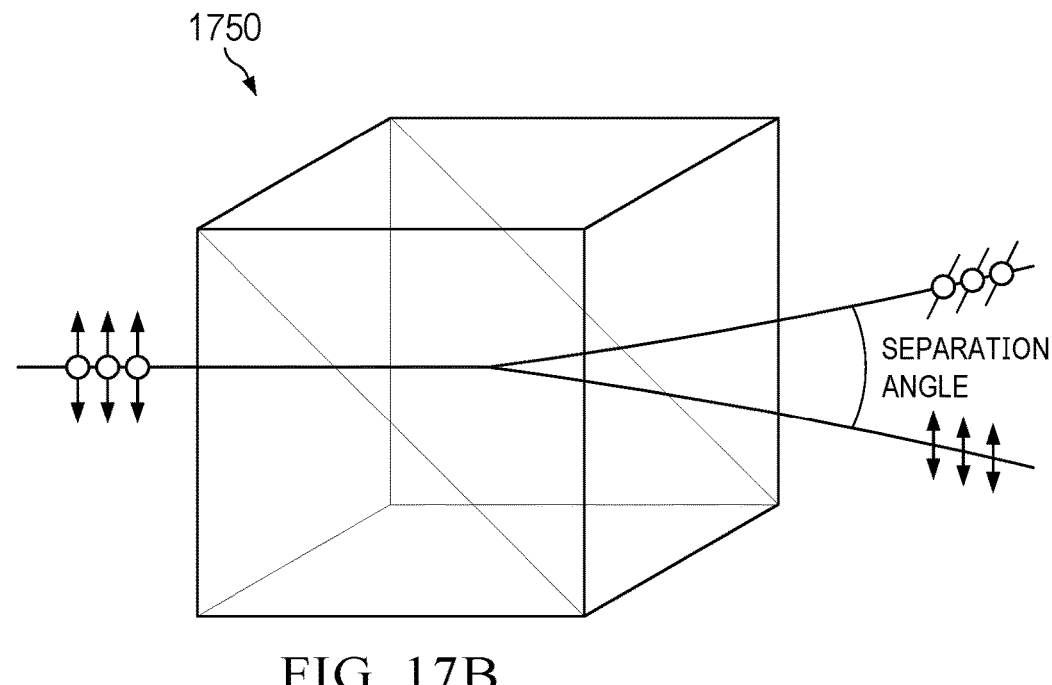
FIG. 17B illustrates an example Wollaston Prism.
Figure 17C:
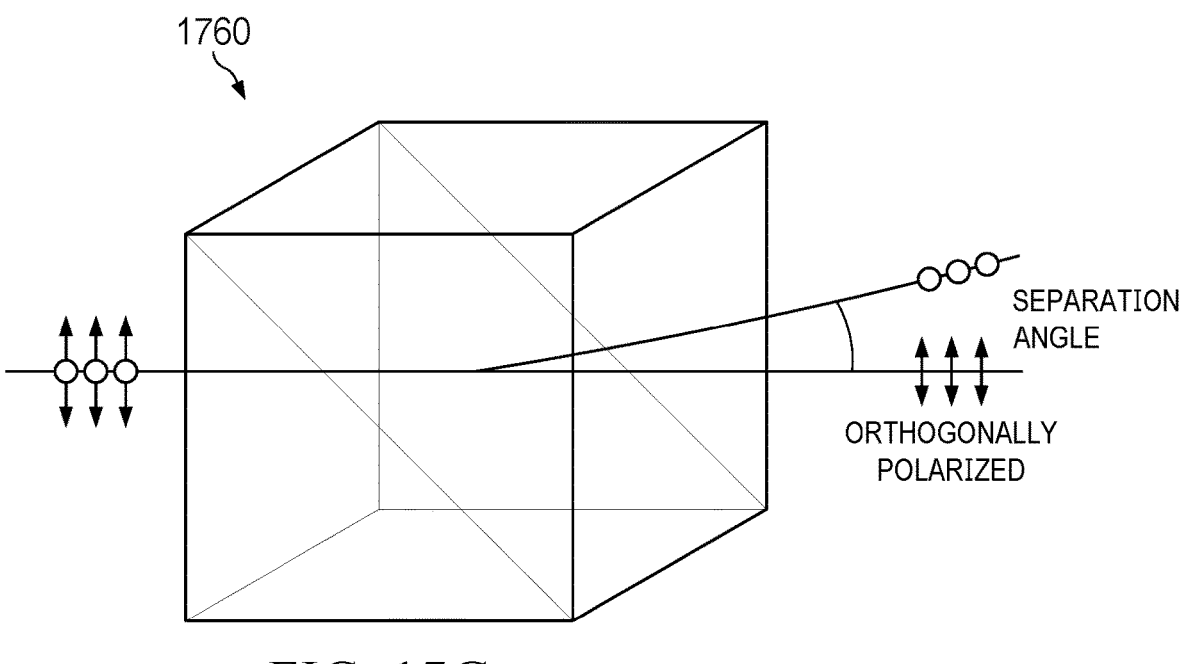
FIG. 17C illustrates an example Rochon prism.

FIG. 17A illustrates an optical projection system 1700, FIG. 17B illustrates a Wollaston prism 1750, and FIG. 17C illustrates a Rochon prism 1760. FIG. 17A illustrates the optical projection system 1700, which may be an example of the optical projection system 100 illustrated in FIG. 1A, the optical projection system 120 illustrated in FIG. 1B, or the optical projection system 170 illustrated in FIG. 1C. The optical projection system 1700 includes a laser light source 1732, an OPM 1708 optically coupled to the laser light source 1732, and a birefringent prism 1710 optically coupled to the OPM 1708. The laser light source 1732 may be an example of the laser light source 102 illustrated in FIG. 1A, the laser light source 122 illustrated in FIG. 1B, the laser light source 172 illustrated in FIG. 1C, or the laser light source 214 illustrated in FIG. 2A. The laser light source 1732 contains at least one laser 1702, at least one laser 1704, and a PBS 1706 optically coupled to the at least one laser 1702 and to the at least one laser 1704. The at least one laser 1702 and the at least one laser 1704 may be an example of the at least one laser 202 illustrated in FIG. 2A. The PBS 1706 may be an example of the optical element 204 illustrated in FIG. 2A. The at least one laser 1702 may be an example of the laser assembly 1302 illustrated in FIG. 13, the at least one laser 1704 may be an example of the laser assembly 1304 illustrated in FIG. 13, and the PBS 1706 may be an example of the optical combining element 1306 illustrated in FIG. 13. The PBS 1706 may be a plate, a cube, or a wire-grid polarizer. The at least one laser 1702 produces a first portion of laser light 1712 having a first polarization. The at least one laser 1704 produces a second portion of laser light 1714 having a second polarization different than the first polarization. In an example, the first polarization is P polarized and the second polarization is S polarized. In another example, the first polarization is S polarized and the second polarization is P polarized. The at least one laser 1702 and the at least one laser 1704 are turned on and off time sequentially. For example, during a first time the at least one laser 1702 is producing the first portion of the laser light 1712 and the at least one laser 1704 is off, not producing the second portion of laser light 1712. Then, during a second time, the at least one laser 1702 is off, not producing the first portion of laser light and the at least one laser 1704 is producing the second portion of laser light 1714. In an example, the at least one laser 1702 and the at least one laser 1704 are laser arrays, which may be arrays of multi-mode laser diodes. In another example, the at least one laser 1702 and the at least one laser 1704 are single laser diodes.

The PBS 1706 is optically coupled to the at least one laser 1702 and to the at least one laser 1704. The PBS 1706 combines the first portion of laser lights 1712 and the second portion of laser light 1714 to produce shaped light 1718. The PBS 1706 transmits the first portion of laser light 1712 having the first polarization and reflects the second portion of laser light 1714 having the second polarization to produce the shaped light 1718 having the first polarization and the second polarization.

The OPM 1708 is optically coupled to the PBS 1706. The OPM 1708 modulates the phase of the shaped light 1718 to produce modulated light 1720 to produce a hologram in the far field. The OPM 1708 may be a PLM, a phase-only LCOS, or another OPM, for example a deformable mirror device. The OPM time sequentially modulates a first portion of the shaped light 1718 having the first polarization and a second portion of the shaped light 1718 having the second polarization using separate holograms.

The birefringent prism 1710 is optically coupled to the OPM 1708. The birefringent prism 1710 receives the modulated light 1720 and separates the light into first image light 1722 having a first polarization and second image light 1724 having a second polarization. The birefringent prism 1710 has a different index of refraction for S polarized light and for P polarized light. The birefringent prism 1710 may be a Wollaston prism 1750, illustrated in FIG. 17B, a Rochon prism 1760, illustrated in FIG. 17C, a calcite prism (not pictured), or a YVO$_4$ prism (not pictured). In a Rochon prism 1760, one of the light beams proceeds straight and the other light beam exits the Rochon prism 1760 at an angle. The output beams from the Rochon prism 1760 are orthogonally polarized. The Wollaston prism 1750 has two orthogonal prisms of birefringent material, for example a uniaxial material such as calcite. The Wollaston prism 1750 may be cemented together at their base, for example with Canada balsam, to form two right triangle prisms with perpendicular optic axes. Outgoing light beams diverge from the Wollaston prism 1750 as ordinary rays and extraordinary rays due to the differences in the indexes of refraction, with the angle of divergence determined by the prisms' wedge angle and the wavelength of the light. The Wollaston prism 1750, the beams are separated at a separation angle. The first image light 1722 produces a first image in a first field of view 1726 and the second image light 1724 produces a second image in a second field of view 1728. The optical projection system 1700 has a point spread function 1730 in the far field, which is the same size as a point spread function of a single field of view, but with twice the total field of view appears smaller.

Moreover, the scope of the present application is not intended to be limited to the particular illustrative example arrangement of the process, machine, manufacture, and composition of matter means, methods and steps described in this specification. As one of ordinary skill in the art will readily appreciate from the disclosure, processes, machines, manufacture, compositions of matter, means, methods or steps, presently existing or later to be developed, that perform substantially the same function or achieve substantially the same result as the corresponding example arrangements described herein may be utilized according to the illustrative arrangements presented and alternative arrangements described, suggested or disclosed. Accordingly, the appended claims are intended to include within their scope such processes, machines, manufacture, compositions of matter, means, methods, or steps.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

The term "optically couple" is used throughout the specification. The term may cover optical connections, communications, or signal paths that enable a functional relationship consistent with this description. For example, if device A generates an optical signal to be transmitted to device B to perform an action, in a first example device A is optically coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A system or device that is described herein as including certain components may instead be adapted to be coupled to those components to form the described structure, device, or apparatus. For example, an apparatus described as including one or more devices (such as OPMs, SLMs or light sources), one or more optical elements (such as lenses), and/or one or more electronic components (such as controllers, processors, or memories) may instead have at least some of the components integrated into a single component which is adapted to be coupled to the remaining components either at a time of manufacture or after a time of manufacture, for example, by an end-user and/or a third-party.

While certain components may be described herein as being of a particular process technology, these components may be exchanged for components of other process technologies. Devices described herein are reconfigurable to include the replaced components to provide functionality at least partially similar to functionality available prior to the component replacement.

Unless otherwise stated, "about," "approximately," or "substantially" preceding a value means+/−10 percent of the stated value. Modifications are possible in the described examples, and other examples are possible within the scope of the claims.

What is claimed is:

1. A system comprising:
at least one laser configured to produce laser light;
an optical element configured to produce shaped light responsive to receiving the laser light;
an optical phase modulator (OPM) optically coupled to the optical element, the OPM configured to modulate the shaped light to produce modulated light;
a dichroic mirror optically coupled to the OPM;
a reflective phosphor optically coupled to the dichroic mirror; and
a reflective diffuser optically coupled to the dichroic mirror.

2. The system of claim 1, wherein the optical element is an optical waveguide.

3. The system of claim 2, wherein the optical waveguide comprises one of an optical fiber bundle, an array of rectangular light guides, and an optical waveguide comprising core and a low index cladding around the core.

4. The system of claim 2, wherein the optical waveguide comprises:
an integrator rod; and
a variable aperture optically coupled to the integrator rod.

5. The system of claim 1, wherein the at least one laser comprises a laser array, and wherein the optical element comprises:
a fast-axis collimator (FAC) lens; and
a slow-axis collimator (SAC) lens optically coupled to the FAC lens.

6. The system of claim 1, wherein the at least one laser is a laser array comprising:
first rows of lasers configured to produce a first portion of the laser light having a first characteristic; and
second rows of lasers configured to produce a second portion of the laser light having a second characteristic different than the first characteristic, and wherein the optical element comprises:

a mirror optically coupled to the second rows of lasers, the mirror configured to reflect the first portion of the laser light to produce reflected light; and
an optical combining element optically coupled to the first row of lasers and to the mirror, the optical combining element configured to:
transmit the first portion of the laser light having the first characteristic; and
reflect the reflected light having the second characteristic.

7. The system of claim 1, wherein the at least one laser is a laser array having a first number of rows, and wherein the optical element comprises a mirror having a second number of mirror segments, the second number the same as the first number, and the mirror segments optically coupled to corresponding rows of lasers.

8. The system of claim 1, wherein the at least one laser is a laser array, and the optical element comprises a cylindrical lens.

9. The system of claim 1, wherein the at least one laser comprises a laser diode configured to produce a first portion of the laser light and a laser array configured to produce a second portion of the laser light, and wherein the optical element comprises an optical combining element configured to combine the first portion of the laser light and the second portion of the laser light.

10. The system of claim 1, wherein the at least one laser comprises a first laser array and a second laser array, and wherein the optical element comprises:
a first fast-axis collimator (FAC) lens optically coupled to the first laser array;
a first slow-axis collimator (SAC) lens optically coupled to the first FAC lens;
a second FAC lens optically coupled to the second laser array;
a second SAC lens optically coupled to the second FAC lens; and
a polarizing beam splitter (PBS) optically coupled to the first FAC lens, the second FAC lens, the first SAC lens, and the second FAC lens.

11. A system comprising:
a first laser assembly configured to produce first light having a first characteristic;
a second laser assembly configured to produce second light having a second characteristic different than the first characteristic;
an optical combining element optically coupled to the first laser assembly and to the second laser assembly, the optical combining element configured to combine the first light having the first characteristic and to the second light having the second characteristic to produce combined light comprising the first light and the second light;
an optical phase modulator (OPM) optically coupled to the optical combining element, the OPM configured to modulate the combined light to produce modulated light;
a first fast-axis collimator (FAC) lens optically coupled to the first laser assembly;
a first slow-axis collimator (SAC) lens optically coupled to the first FAC;
a second FAC lens optically coupled to the second laser assembly; and
a second SAC lens optically coupled to the second FAC.

12. The system of claim 11, wherein the first laser assembly comprises a laser array and the second laser assembly comprises a single laser diode.

13. The system of claim 11, wherein the optical combining element is a first PBS, the first characteristic is a first polarization, the second characteristic is a second polarization, and the combined light is first combined light, the system further comprising:

a second PBS optically coupled to the OPM, the second PBS configured to transmit a first portion of the modulated light having the first polarization and to reflect a second portion of the modulated light having the second polarization;

first relay optics optically coupled to the second PBS, the first relay optics configured to transmit the first portion of the modulated light as first path light;

a first mirror optically coupled to the second PBS, the first mirror configured to reflect the second portion of the modulated light as first reflected light;

second relay optics optically coupled to the first mirror, the second relay optics configured to transmit the first reflected light as second path light;

a second mirror optically coupled to the second relay optics, the second mirror configured to reflect the second path light as second reflected light; and a third PBS optically coupled to the second mirror and to the second relay optics, the second PBS configured to transmit the first path light and to reflect the second reflected light.

14. The system of claim 13, further comprising:

a dichroic mirror optically coupled to the third PBS;

a reflective phosphor optically coupled to the dichroic mirror; and a reflective diffuser optically coupled to the dichroic mirror.

15. The system of claim 11, wherein the first laser assembly comprises a first laser array and the second laser assembly comprises a second laser array.

16. The system of claim 11, further comprising a birefringent prism optically coupled to the OPM.

17. A system comprising:

at least one laser configured to produce laser light;

an optical element configured to produce shaped light responsive to receiving the laser light;

an optical phase modulator (OPM) optically coupled to the optical element, the OPM configured to modulate the shaped light to produce modulated light, wherein the optical element is configured to reduce a point spread function of the modulated light in a far field;

a spatial light modulator (SLM) optically coupled to the OPM, the SLM configured to produce an image based on the modulated light; and a birefringent prism optically coupled to the OPM.

18. The system of claim 17, wherein the optical element is an optical waveguide.

19. The system of claim 17, wherein the at least one laser comprises at least one first laser configured to produce a first portion of the laser light having a first characteristic and at least one second laser configured to produce a second portion of the laser light having a second characteristic different than the first characteristic, and wherein the optical element comprises an optical combining element optically coupled to the at least one first laser and to the at least one second laser, the optical combining element configured to combine the first portion of the laser light having the first characteristic and the second portion of the laser light having the second characteristic.

* * * * *